United States Patent
Kong

(10) Patent No.: US 7,268,705 B2
(45) Date of Patent: Sep. 11, 2007

(54) INPUT DETECTION BASED ON SPECKLE-MODULATED LASER SELF-MIXING

(75) Inventor: Yuan Kong, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 190 days.

(21) Appl. No.: 11/154,828

(22) Filed: Jun. 17, 2005

(65) Prior Publication Data

US 2006/0284743 A1 Dec. 21, 2006

(51) Int. Cl.
*H03M 11/04* (2006.01)

(52) U.S. Cl. ............ 341/31; 379/368; 345/168

(58) Field of Classification Search .......... 341/13, 341/14, 17, 22, 26, 31; 178/18.09, 18.11; 379/368; 345/168, 170, 175
See application file for complete search history.

(56) References Cited

U.S. PATENT DOCUMENTS

| | | | |
|---|---|---|---|
| 3,954,335 A | 5/1976 | Bodlaj | |
| 4,240,745 A | 12/1980 | Green | |
| 4,379,968 A * | 4/1983 | Ely et al. | 250/229 |
| 4,721,385 A | 1/1988 | Jelalian et al. | |
| 5,114,226 A | 5/1992 | Goodwin et al. | |
| 5,125,736 A | 6/1992 | Vaninetti et al. | |
| 5,274,361 A | 12/1993 | Snow | |
| 5,274,363 A | 12/1993 | Koved et al. | |
| 5,475,401 A | 12/1995 | Verrier et al. | |
| 5,510,604 A | 4/1996 | England | |
| 5,781,297 A | 7/1998 | Castore | |
| 6,015,089 A | 1/2000 | Hecht et al. | |
| 6,040,914 A | 3/2000 | Bortz et al. | |
| 6,333,735 B1 | 12/2001 | Anvekar | |
| 6,525,677 B1 * | 2/2003 | Printzis | 341/31 |
| 6,646,723 B1 | 11/2003 | Dubovitsky et al. | |
| 6,687,274 B2 | 2/2004 | Kahen | |
| 6,872,931 B2 | 3/2005 | Liess et al. | |
| 6,903,662 B2 * | 6/2005 | Rix et al. | 341/22 |
| 2002/0117549 A1 | 8/2002 | Lee | |
| 2002/0158838 A1 | 10/2002 | Smith et al. | |
| 2003/0006367 A1 | 1/2003 | Liess et al. | |
| 2003/0085284 A1 | 5/2003 | Bremer et al. | |

(Continued)

FOREIGN PATENT DOCUMENTS

GB 2383231 A 6/2003

(Continued)

OTHER PUBLICATIONS

T. Bosch, et al., "The Self-Mixing Interference Inside a Laser Diode: Application to Displacement, Velocity and Distance Measurement", Proc. SPIE, vol. 3478, pp. 98-108, Jul. 1998.

(Continued)

*Primary Examiner*—Brian Zimmerman
*Assistant Examiner*—Hung Q Dang
(74) *Attorney, Agent, or Firm*—Banner & Witcoff, Ltd.

(57) ABSTRACT

A keyboard detects press or release of keys based on laser output which is changed by speckle-modulated self-mixing. Unique targets are attached to keys. As a target is moved into and/or out of the path of a laser, speckling causes light to shine back into the laser's emitting cavity. Variations in laser output are analyzed to identify the key moved and the direction of movement.

16 Claims, 24 Drawing Sheets

U.S. PATENT DOCUMENTS

| | | |
|---|---|---|
| 2003/0085878 A1 | 5/2003 | Luo |
| 2003/0128188 A1 | 7/2003 | Wilbrink et al. |
| 2003/0128190 A1 | 7/2003 | Wilbrink et al. |
| 2004/0004128 A1 | 1/2004 | Pettinelli et al. |
| 2004/0075823 A1 | 4/2004 | Lewis et al. |
| 2004/0095323 A1 | 5/2004 | Ahn |
| 2004/0213311 A1 | 10/2004 | Johnson et al. |
| 2004/0227954 A1 | 11/2004 | Xie |
| 2004/0228377 A1 | 11/2004 | Deng et al. |
| 2004/0246460 A1 | 12/2004 | Auracher et al. |
| 2005/0068300 A1 | 3/2005 | Wang et al. |
| 2005/0156875 A1 | 7/2005 | Kong |
| 2005/0157202 A1 | 7/2005 | Lin et al. |
| 2005/0179658 A1 | 8/2005 | Huang et al. |
| 2005/0231484 A1 | 10/2005 | Gordon et al. |

FOREIGN PATENT DOCUMENTS

| | | |
|---|---|---|
| WO | WO 2005/076116 A2 | 8/2005 |

OTHER PUBLICATIONS

Shigenobu Shinohara, et al., "Compact and High-Precision Range Finder with Wide Dynamic Range and its Application", IEEE Transactions on Instrumentation and Measurement, vol. 41, No. 1, pp. 40-44, Feb. 1992.

Roland E. Best, "Phase-Locked Loops, Theory, Design, and Applications", McGraw-Hill Book Company, pp. 151-164, 1984 (15 pages).

H. Yeh, et al., "Localized Fluid Flow Measurements with an He-Ne Laser Spectrometer", Appl. Phys. Lett., vol. 4, No. 10, pp. 176-178, May 15, 1964.

S.W. James, et al., "Fiber Optic Based Reference Beam Laser Doppler Velocimetry", Optics Communications, 119, pp. 460-464, Sep. 15, 1995.

M.J. Rudd, "A New Theoretical Model for the Laser Dopplermeter", J. Phys. E2, pp. 56-58, 1969.

M.J. Rudd, "A Laser Doppler Velocimeter Employing the Laser as a Mixer-Oscillator", J. Phys. E1, Series 2, vol. 1, pp. 723-726, Feb. 21, 1968.

T. Ito, et al., "Integrated Microlaser Doppler Velocimeter", J. Lightwave Tech., vol. 17, No. 1, pp. 30-34, Jan. 1999.

E.T. Shimizu, "Directional Discrimination in the Self-Mixing Type Laser Doppler Velocimeter", Appl. Opt., vol. 25, No. 21, pp. 4541-4544, Nov. 1987.

S.K. Özdemir, et al., "New Speckle Velocimeter Using Two Self-Mixing Laser Diodes", SICE 115C-3, pp. 947-950, Jul. 29-31, 1997.

S.L. Toh, et al., "Whole Field Surface Roughness Measurement by Laser Speckle Correlation Technique", Optics and Laser Technology, 33, pp. 427-434, Jun. 5, 2001.

M. Nagahara, et al., "Real-Time Blood Velocity Measurements in Human Retinal Vein Using the Laser Speckle Phenomenon", Japanese Journal of Ophthalmology, 43, pp. 186-195, 1999.

T. Shibata, et al., "Laser Speckle Velocimeter Using Self-Mixing Laser Diode", IEEE Transactions on Instrumentation and Measurement, vol. 45, No. 2, pp. 499-503, Apr. 2, 1996.

S. Kato, et al., "Optical Fibre Laser Doppler Velocimetry Based on Laser Diode Frequency Modulation", Optical and Laser Technology, vol. 27, No. 4, pp. xii, 1995.

W.H. Stevenson, "Optical Frequency Shifting by means of a Rotating diffraction Grating ", Appl. Opt. 9, vol. 9, No. 3, pp. 649-652, Mar. 1970.

M.K. Mazumber, et al., "Laser Doppler Velocity Measurement Without Directional Ambiguity By Using Frequency Shifted Incident Beams", Appl. Phys. Lett., vol. 16, No. 1, pp. 462-464, Jun. 1, 1970.

S. Shinohara, et al., "Laser Doppler Velocimeter Using the Self-Mixing Effect of a Semiconductor Laser Diode", Appl. Opt., vol. 25, No. 9, pp. 1417-1419, 1986.

H.W. Jentink, et al., "Small Laser Doppler Velocimeter Based on the Self-Mixing Effect in a Diode Laser", Appl. Opt. vol. 27, No. 2, pp. 379-385, Jan. 15, 1998.

S. Shinohara, et al., "Acquisition of 3-D Image of Still or Moving Objects Utilizing Laser Diode Range-Finding Speedometer", IEEE, pp. 1730-1735, 1993.

L. Fabiny, et al., "Interferometric Fiber-Optic Doppler Velocimeter with High-Dynamic Range", IEEE Photonics Tech. Lett., vol. 9, No. 1, pp. 79-81, Jan. 1997.

S. Shinohara, et al., "Detection of Mesa Spots and Indents on Slowly Moving Object Surface by Laser-Light Beam Scanning", SICE, 105C-5, pp. 1167-1170, Jul. 26-28, 1995.

Y. Kakiuchi, et al., "Measurement of Small Vibrational Displacement by SM LD Vibrometer with Resonance Element", SICE, 107 A-4, pp. 903-906, Jul. 29-31, 1998.

N. Tsukuda, et al., "New Range-Finding Speedometer Using a Self-Mixing Laser Diode Modulated by Triangular Wave Pulse Current", IEEE, WEAM 4-1, pp. 332-335, May 1994.

H.W. Jentink, et al., "Small Laser Doppler Velocimeter Based on the Self-Mixing Effect in a Diode Laser", Appl. Opt., 27, 2, pp. 379-385, 1998.

Roy Lang, et al., "External Optical Feedback Effects on Semiconductor Injection Laser Properties", IEEE Journal of Quantum Electronics, vol. QE-16, No. 3, pp. 347-355, Mar. 3, 1980.

Acket, G., et al., "The Influence of Feedback Intensity on Longitudinal Mode Properties and Optical Noise in Index-Guided Semiconductor Lasers", IEEE Journal of Quantum Electronics, vol. QE-20, No. 10, pp. 1163-1169, Oct. 1984.

P.J. de Groot, et al., "Ranging and Velocimetry Signal Generation in a Backscatter-Modulated Laser Diode", Appl. Opt., vol. 27, No. 21, pp. 4475-4480, Nov. 1988.

P.A. Porta, "Laser Doppler Velocimetry by Optical Self-Mixing in Vertical-Cavity Surface-Emitting Lasers", IEEE Photonics Technology Letters, vol. 14, No. 12, pp. 1719-1721, Dec. 2002.

S.K. Özdemir, et al., "Effect of Linewidth Enhancement Factor on Doppler Beat Waveform Obtained From a Self-Mixing Laser Diode", Optical Review, vol. 7, No. 6, pp. 550-554, Jun. 22, 2000.

S. Shinohara, et al., "Compact and Versatile Self-Mixing Type Semiconductor Laser Doppler Velocimeters with Direction-Discrimination Circuit", IEEE Transactions on Instrumentation and Measurement, vol. 38, No. 2, pp. 574-577, Apr. 1989.

James H. Chumside, "Laser Doppler Velocimetry by Modulating a $CO_2$ Laser with Backscattered Light", Appl. Opt., vol. 23, No. 1, pp. 61-66, Jan. 1984.

M.H. Koelink, et al., "Laser Doppler Velocimeter Based on the Self-Mixing Effect in a Fiber-Coupled Semiconductor Laser: Theory", Appl. Opt., vol. 31, No. 18, pp. 3401-3408, Jun. 20, 1992.

W.M. Wang, et al., "Self-Mixing Interference in a Diode Laser: Experimental Observations and Theoretical Analysis", Appl. Opt., vol. 32, No. 9, pp. 1551-1558, Mar. 20, 1993.

Guido Giuliani, et al., "Laser Diode Self-Mixing Technique for Sensing Applications", J. Opt. A: Pure Appl. Opt, 4, vol. 4, No. 6, pp. S283-S294, Nov. 4, 2002.

Richard C. Addy, et al., "Effects of External Reflector Alignment in Sensing Applications of Optical Feedback in Laser Diodes", IEEE Journal of Lightwave Technology, Dec., vol. 14, No. 12, pp. 2672-2676, Dec. 1996.

S.F. Yu, "Theoretical Analysis of Polarization Bistability in Vertical Cavity Surface Emitting Semiconductor Lasers", IEEE Journal of Lightwave Technology, vol. 15, No. 6, pp. 1032-1041, Jun. 1997.

F. Robert, et al., "Polarization Modulation Dynamics of Vertical-Cavity Surface-Emitting Lasers with an Extended Cavity", IEEE Journal of Quantum Electronics, vol. 33, No. 12, 2231-2239, Dec. 1997.

J. Danckaert, et al., "Minimal Rate Equations Describing Polarization Switching in Vertical-Cavity Surface-Emitting Lasers", Optics Communications, vol. 201, pp. 129-137, Jan. 2002.

J. Martin-Regalado, et al., "Polarization Properties of Vertical-Cavity Surface-Emitting Lasers", IEEE Journal of Quantum Electronics, vol. 33, No. 5, pp. 765-783, May 1997.

S. Donati, et al., "Laser Diode Feedback Interferometer for Measurement of Displacements Without Ambiguity", IEEE Journal of Quantum Electronics, vol. 31, No. 1, pp. 113-119, Jan. 1995.

K. Petermann, et al., "External Optical Feedback Phenomena in Semiconductor Lasers", IEEE Journal of Selected Topics in Quantum Electronics, vol. 1, No. 2, pp. 480-489, Jun. 1995.

"Optical Mouse Saves Space", <http://www.optics.org/articles/news/8/6/23/1>, date of first publication unknown, but believed to be Jun. 26, 2002.

Hewett, Jacqueline, "Holey VCSELs Produce High Powers", <http://www.optics.org/articles/news/10/12/5/1>, date of first publication unknown, but dated Dec. 2004; 2 pages.

"Ultra-miniature Laser Displacement Sensors", <http://www.globalspec.com/FeaturedProducts/Detail/BaumerElectric/Ultraminiature_Laser_Displacement_Sensors/13470/1>, first date of publication unknown, but prior to Sep. 12, 2005, 2 pages.

Nerin, P., et al., "Absolute Distance and Velocity Measurements by the FMCW Technique and Self-Mixing Interference Effect Inside a Single-Mode Nd:YAG-LiTAO$_3$ Microchip Laser", Journal of Optics, vol. 29, No. 3, Jun. 1998.

Lowery, James, et al., "Design and Simulation of a Simple Laser Rangefinder Using a Semiconductor Optical Amplifier-Detector", Optics Express, vol. 13, No. 10, May 16, 2005; pp. 3647-3652.

Maier, T., et al., "A Compact Sensor for Interferometric Displacement Measurements", <http://www.fke.tuwien.ac.at/Publications/jb/fdjb99/tm.htm>, first date of publication unknown, but dated 1999, 2 pages.

"Laser Sensors Offer Long Stand-off and Measurement Range", ThomasNet Industrial news Room, <http://www.news.thomasnet.com/fullstory/458005/1782>, date of first publication unknown, but dated Dec. 3, 2004, 5 pages.

Houghton, Andrew, et al., "A Method for Processing Laser Speckle Images to Extract High-Resolution Motion" pp. 611-617, Meas. Sci. Technol. 8 (1997), published Feb. 24, 1997.

Yamaguchi, Ichirou, et al., "Stabilized and Accelerated Speckle Strain Gauge", SPIE Conference on Laser Interferometry: Quantitative Analysis of Interferograms: Third in a Series, Aug. 1989; published Sep. 22, 1991; 8 pages.

Taka, Nobukatsu, et al., Displacement Measurement of Speckles Using a 2-D Level-cross Technique, Applied Optics, vol. 22, No. 22, published Nov. 15, 1983; pp. 3514-3519.

Shaked, Doran, et al., "Graphical Indicia", 2.2 Barcode-Reading Sub-System, <http://www.hpl.hp.com/research/isl/vsb/GraphIndicialCIP.pdf>, first date of publication unknown but, on or before Oct. 13, 2005, 4 pages.

Tsaur, Jiunnjye, et al., "2D Micro Scanner Actuated by Sol-gel Derived Double Layered PZT", National Institute of Advanced Industrial Science and Technology (AIST), <http://toshi.fujita3.lis.u-tokyo.ac.jp/Optical_MEMS_Archives/MEMS%202002/Book/135.PDF>, first date of publication unknown, but on or before 2002, pp. 548-551.

Sasaki, Minoru, et al., "Optical Scanner on a Three-Dimensional Microoptical Bench", Journal of Lighwave Technology, vol. 21, Issue 3, 602, Mar. 2003, <http://jlt.osa.org/abstract.cfm?id=72540>, 1 page.

Liess, Martin, et al., "A Miniaturized Multidrectional Optical Motion Sensor and Input Device Based on Laser Self-Mixing", Meas. Sci. Technol. 13, 2001-2006; <http://www.iop.org/EJ/abstract/0957-0233/13/12/327>, Nov. 1, 2002; Issue 12; 2 pages.

Goklurk, S. Burak, et al., "A Time-Of-Flight Depth Sensor—System Description, Issues and Solutions," cvprw, p. 35, 2004 Conference on Computer Vision and Pattern Recognition Workshop (CVPRW'04), vol. 3, 2004, 9 pages.

"How Does 3DV's Technology Work?", <http://www.3dvsystems.com/technology/technology.html>, first date of publication unknown but on or before Oct. 13, 2005, 7 pages.

Gokturk, Salih Burak, et al., "3D Head Tracking Based on Recognition and Interpolation Using a Time-of-Flight Depth Sensor," cvpr, pp. 211-217, 2004 IEEE Computer Society Conference on Computer Vision and Pattern Recognition (CVPR'04)—vol. 2, 2004, 7 pages.

Wu, Qingguang, et al., "New Vibrometer Using Self-Mixing Laser Diode Modulated with Triangular Current", Shizuoka University, Cleo/Pacific Rim/, pp. 290-291 (1997).

Tsukuda, Naoki, et al., "New Range-Finding Speedometer Using a Self-Mixing Laser Diode Modulated by Triangular Wave Pulse Current", Shizuoka University, Weam 4-1, (1994), pp. 332-335.

Besnard, Pascal, et al., "Microwave Spectra in External-Cavity Semiconductor Lasers: Theoretical Modeling of Multipass Resonances", IEEE Journal of Quantum Electronics, pp. 1713-1722, (Aug. 1994) vol. 30, No. 8.

Besnard, Pascal, et al., "Feedback Phenomena in a Semiconductor Laser Induced by Distant Reflectors", IEEE Journal of Quantum Electronics, pp. 1271-1284, (May 1993) vol. 29, No. 5.

Short Talk: Fitt's Law & Text Input, New Horizons, "Interface with Pre-Typing Visual Feedback for Touch Sensitive Keyboard", pp. 750-751, CHI 2003.

Bazin, G., et al., "A New Laser Range-Finder Based on FMCW-Like Method", IEEE Instrumentation and Measurement Technology Conference, (1996), pp. 90-93.

Peng, Gang, et al., "Design of 3-D Mouse Using Ultrasonic Distance Measurement", International Conference on Sensors and Control Techniques, pp. 226-229, (2000), Proceedings of SPEI, vol. 4077.

Shinohara, Shigenobu, et al., "High-Resolution Range Finder with Wide Dynamic Range of 0.2m to 1m Using a Frequency-Modulated Laser Diode", pp. 646-651, (1989), IEEE.

Bosch, Thierry, et al., "Three-Dimensional Object Construction Using a Self-Mixing Type Scanning Laser Range Finder", pp. 1326-1329, (1998), IEEE Transactions on Instrumentation and Measurement, vol. 47, No. 5.

Dorsch, Rainer G., et al., "Laser Triangulation: Fundamental Uncertainty in Distance Measurement", pp. 1306-1314, (1994), Applied Optics, vol. 33, No. 7.

D. Dupuy, et al., "Improvement of the FMCW Laser Range-Finder by an APD Working as an Optoelectronic Mixer," IEEE Transactions on Instrumentation and Measurement, 51, 5, pp. 1010-1014, 2002.

R.P. Griffiths, et al., "Cavity-resonant Optical Position Sensor-A New Type of Optical Position Sensor," p. 328, CLEO, 1998.

Dupuy, D., et al., "A FMCW Laser Range-Finder Based on a Delay Line Technique", pp. 1084-1088, (2001), IEEE Instrumentation and Measurement Technology Conference.

Journet, B., et al., "High Resolution Laser Range-Finder Based on Phase-Shift Measurement Method", pp. 123-132, (1998), SPIE vol. 3520.

Favre-Bulle, Bernard, et al., "Efficient Tracking of 3D-Robot Positions by Dynamic Triangulation", pp. 446-449, (1998), IEEE ITMC Session on Instrumentation and Measurement in Robotics.

Bosch, T, et al., "A Low-Cost, Optical Feedback Laser Range-Finder with Chirp Control", (2001), IEEE Instrumentation and Measurement Technology Conference.

Tucker, John, "Laser Range Finder Using the Self-Mixing Effect in a Vertical Cavity Surface Emitting Laser" (VCSEL), pp. 1-71, (2001).

De Groot, Peter, et al., "Chirped Synthetic-Wavelength Interferometry", pp. 1626-1628, (1992), Optics Letters, vol. 17, No. 22.

Gelmini, E, et al., "Tunable, Double-Wavelength Heterodyne Detection Interferometer for Absolute-Distance Measurements", pp. 213-215, (1994), Oprics Letters, vol. 19, No. 3.

IBM Technical Disclosure Bulletin, "Ultrasonic Cursor Position Detection", pp. 6712-6714, (1985), vol. 27, No. 11.

Tucker, J.R., et al., "Laser Range Finding Using the Self-Mixing Effect in a Vertical-Cavity Surface Emitting Laser", pp. 583-586, (2002), Conference on Optoelectronic and Microelectronic Materials and Devices.

Journet, B, et al., "A Low-Cost Laser Range Finder Based on an FMCW-Like Method", pp. 840-843 (2000), IEEE Transactions on Instrumentation and Measurement, vol. 49, No. 4.

Marques, Lino, et al., "3D Laser-Based Sensor for Robotics", pp. 1328-1331, (1994) ISR-Institute of Systems and Robotics.

Marques, Lino, et al., "A New 3D Optical Triangulation Sensor for Robotics", pp. 512-517, (1998), IEEE International Workshop on Advanced Motion Control.

Preucil, Libor, "Building a 2D Environment Map From Laser Range-Finder data", pp. 290-295, (2000), IEEE Intelligent Vehicle Symposium.

Nyland, Lars S., et al., "Capturing, Processing and Rendering Real-World Scenes", IEEE, 2001.

Onodera, Ribun, et al., "Effect of Laser-Diode Power Change on Optical heterodyne Interferometry", pp. 675-681, (1995), Journal of Lightwave Technology, vol. 13, No. 4.

Besesty, Pascal, et al., "Compact FMCW Advanced Laser Range Finder", pp. 552-553, (1999) Technical Digest: Conference on Lasers and Electro-Optics.

Poujouly, Stephane, et al., Digital Laser Range Finder: Phase-Shift Estimation by Undersampling Technique, pp. 1312-1317, (1999), IEEE.

Zheng, Jiang A., "A Flexible Laser Range Sensor Based on Spatial-Temporal Analysis", (2000), Proceedings of the International Conference on Pattern Recognition.

Dandliker, R., et al., "Two-Wavelength Laser Interferometry Using Superheterodyne Detection", pp. 339-341, Optics Letters, (1998) vol. 13, No. 5.

Zou, Q., et al. "Silicon Capacitive Microphones with Corrugated Diaphragms", School of Mechanical and Production Engineering, Nanyang Technological University; date of first publication unknown, but believed to be prior to Sep. 30, 2003.

Rombach, Pirmin, et al., "A Low-Voltage Silicon Condenser Microphone for Hearing Instrument Applications, Microtronic A/S"; date of first publication unknown, but believed to be prior to Sep. 30, 2003.

Shinoda, Yukitaka, et al., "Real-Time Computation of Distance and Displacement by Software Instruments Using Optical Frequency Modulation", pp. 82-83, (2002), SICE.

Cole, Timothy, et al., "Flight Characterization of the Near Laser Rangefinder", pp. 131-142, (2000), Laser Radar Technology and Applications, Proceedings of SPIE vol. 4035.

Viarani, Luigi, et al., "A CMOS Smart Pixel for Active 3-D Vision Applications", pp. 145-152, (2004), IEEE Sensors Journal, vol. 4, No. 1.

Wakitana, Jun, et al., "Wrist-Mounted Laser Rangefinder", pp. 362-367, (1995) Proceedings of the International Conference on Intelligent Robots and Systems.

Zahid, M., et al., "High-Frequency Phase Measurement for Optical Rangefinding System", pp. 141-148, (1997), IEEE Proceedings Science and Measurements Technology, vol. 144, No. 3.

Whetstone, Albert, "Free-Hand Data Input", pp. 11-28, Science Accessories Corporation (1970).

Acroname Articles, Demystifying the Sharp IR Rangers, <http://www.acroname.com/rootics/info/articles/sharp/sharp.html> (First published before Sep. 14, 2004).

Gagnon, Eric, "Laser Imaging Using the Self-Mixing Effect in a Laser Diode", pp. 693-699, (1999), IEEE Transaction on Instrumentation and Measurement, vol. 48, No. 3.

Canesta, Inc., "Data Input Alternatives for Mobile Devices", pp. 1-5, Nov. 28, 2002.

Steinmetz, Robert, et al., "Solving the Data Input Problem in Mobile Devices", pp. 1-6, Sep. 2002.

Tomasi, Carlo, et al., "Full Size Projection Keyboard for Handheld Devices", pp. 70-75, (2003) Communications of the ACM, vol. 46, No. 7.

Hebert, Martial, "Active and Passive Range Sensing for Robotics", pp. 102-110, (2000) IEEE International Conference for Robotics and Automation.

"Laser-Based Tracking for Real-Time 3D Gesture Acquisition", <http://www.k2.t.u-tokyo.ac.jp/fusion/LaserActiveTracking/index-e.html>; first published on or before Aug. 3, 2004.

Aeroflex Mixed-Signal Asics, "Choosing an Ultrasonic Sensor for Proximity or Distance Measurement", Part 1: Acoustic Considerations <http://www.sensorsmag.com/articles/0299/acou0299/main.shtml>; first published in 1999.

Aeroflex Mixed-Single Asics, "Choosing an Ultrasonic Sensor for Proximity or Distance Measurement", Part 2: Optimizing Sensor Selection <http://www.sensormag.com/articles/0399/0399_28/main.shtml>; first published in 1999.

Canesta Keyboard <http://www.canesta.com/cansetakeyboard.htm>; first published on or after Aug. 3, 2004.

Canesta Keyboard, <http://www.canesta.com/faq.htm>; first published on or after Aug. 3, 2004.

Sahin Kaya Ozdemir, et al., "Velocity Measurement by a Self-Mixing Laser Diode Using Speckle Correlation", IEEE, 1999, pp. 1756-1760.

Wang, W.M., et al., "Self-Mixing Interference Inside a Single-Mode Diode Laser for Optical Sensing Applications," pp. 1577-1587, Journal of Lightwave Technology, vol. 12, No. 9 (1994).

Logitech® G7 Laser Cordless Mouse; <http://www.logitech.com/index.cfm/products/details/US/EN, CRID=2135,CONTENTID=10716>; date of first publication unknown, but on or before Oct. 24, 2005; 3 pages.

Logitech® MX™1000 Laser Cordless Mouse; <http://www.logitech.com/index.cfm/products/details/US/EN,CRID=3,CONTENTID=9043,a d=g03&srch=1>; date of first publication unknown, but on or before Oct. 24, 2005; 3 pages.

5-Button USB Laser Mouse; <http://www.iogear.com/main.php?loc=product&Item=GME521>; date of first publication unknown, but on or before Oct. 24, 2005; 3 pages.

* cited by examiner

| key | down | up |
|---|---|---|
| 12(3) | $h_c(3); h_b(3); h_a(3)$ | $h_a(3); h_b(3); h_c(3)$ |
| 12(4) | $h_c(4); h_b(4); h_a(4)$ | $h_a(4); h_b(4); h_c(4)$ |
| 12(5) | $h_c(5); h_b(5); h_a(5)$ | $h_a(5); h_b(5); h_c(5)$ | in-memory LUT

INPUT DETECTION BASED ON SPECKLE-MODULATED LASER SELF-MIXING

BACKGROUND

The keyboard is an important tool for providing textual, command and other input to a computer or other electronic device. Although pointing devices (e.g., mice, touchpads, etc.), handwriting detectors (e.g., electronic digitizers and styli) and other input mechanisms continue to develop and offer numerous advantages in many situations, the keyboard will remain a primary input device for the foreseeable future. As critical as keyboards are, however, the basic design has remained the same for many years. In particular, a keyboard generally includes a matrix of electrical switches resting beneath a collection of keys. When a key is pressed, an electrical contact is made in the corresponding switch. A microprocessor periodically scans the switch matrix, and upon detecting a switch closure or opening, signals a press or release of a corresponding key.

Some alternative keyboard technologies have been developed. In some systems, for example, an image of a keyboard is displayed on a surface in front of a handheld computing device. Radar or another type of sensor within the computing device then detects a press of a projected "virtual" key when the user's finger is in the region corresponding to a projection of that key. Although useful, such technology is not a complete substitute for a mechanical keyboard. For example, many users rely on the tactile sensation of pressing keys; virtual keyboards do not offer this feature. Moreover, projected keyboards require a flat surface in order to function, and may not operate well in strong ambient lighting conditions.

Conventional keyboard technology limits the degree to which keyboard manufacturing costs can be reduced. A new key detection technology reducing or eliminating the need for a switch matrix, but maintaining the presence of actual keys providing a suitable tactile response and/or not affected by strong ambient light, would offer a significant advantage. Elimination of a switch matrix would also allow greater flexibility in changing the size and/or shape of a keyboard.

SUMMARY

In at least some embodiments of the invention, a keyboard detects presses or releases of keys based on laser output which is changed by speckle-modulated self-mixing. Targets are attached to keys of the keyboard. As a key is pressed or released, the target is moved into and/or out of the path of a laser. As the target (or a portion thereof) passes though the laser beam, an interference pattern is created by random backscattering from the target surface. A portion of this interference pattern (or "speckle") shines back into the laser's emitting cavity and induces variations in laser output because of the self-mixing effect. Variations in laser output are then analyzed to detect movement of the key to which the target is attached. In at least some embodiments, detection circuitry is configured to determine the direction of key motion (i.e., up or down) and/or to detect velocity of key movement. In some embodiments, certain keys have unique target patterns. A key coupled to one of those targets can then be identified based on a unique target pattern. The invention is not limited to keyboards, and embodiments include other types of input devices in which a user may manipulate buttons, levers, switches or other types of control pieces, and where movement of such control pieces is detected using speckle-modulated laser self-mixing.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
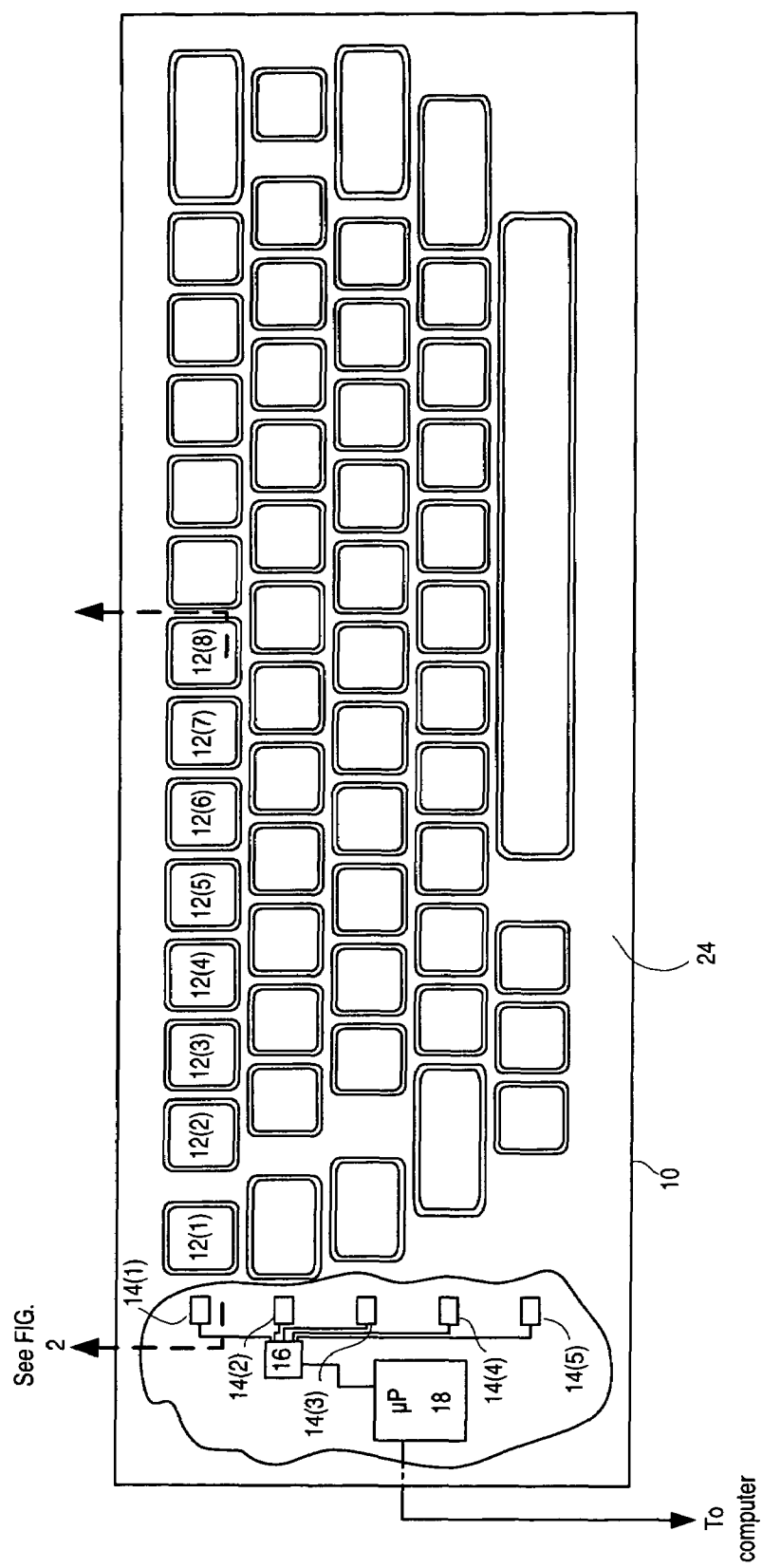
FIG. 1 is a diagram of a keyboard according to at least some embodiments.

FIG. 1 is a diagram of a keyboard 10 according to at least some embodiments of the invention. Although keyboard 10 is shown with a collection of keys arranged in a manner similar to that of a common office keyboard, the invention is not limited by the type, number or arrangement of keys or other user controls. For ease of reference, but so as to avoid unnecessary detail, a portion of the keys shown in FIG. 1 are numbered 12(1)-12(8). The keys of keyboard 10 are attached to portions (not shown in FIG. 1 but shown in FIG. 2) extending through an upper case 24. Shown in a partial cutaway at the side of keyboard 10 are five laser key detection sensors 14(1)-14(5) positioned at the far end of each row of keys. As described in more detail below, each of sensors 14(1)-14(5) includes a laser diode and a light-sensitive element.

Each of sensors 14(1)-14(5) is electrically coupled to detection circuitry 16. Detection circuitry 16 (which may be, e.g., a microprocessor having an on-chip ADC) contains circuitry for identifying, based on characteristics detected by one of sensors 14(1)-14(5), a key that has been moved and the direction of movement. The manner in which detection circuitry 16 makes these determinations is described below. Data output by detection circuitry 16 is received by controller 18. Although controller 18 is shown as (and will subsequently be referred to as) a microprocessor, controller 18 could alternatively include state machine circuitry or other suitable components capable of controlling operation of keyboard 10 as described herein. Microprocessor 18 reports key presses and releases to a computer or other device receiving keyboard output. Key presses and releases can be reported to a computer or other device using any of various methods known in the art. For example, the press or release of a key could be transmitted using a Human Interface Device (HID) report generated in compliance with the Device Class Definition for Human Input Devices, the Universal Serial Bus (USB) Specification, the USB HID Usage Tables, Human Interface Device Profile v.1.0, and other related documents available from the USB Implementers Forum, Inc. at <http://www.usb.org>. In at least some embodiments, controller 18 and detection circuitry 16 may be combined into a single integrated circuit (IC) device.

Figure 2:
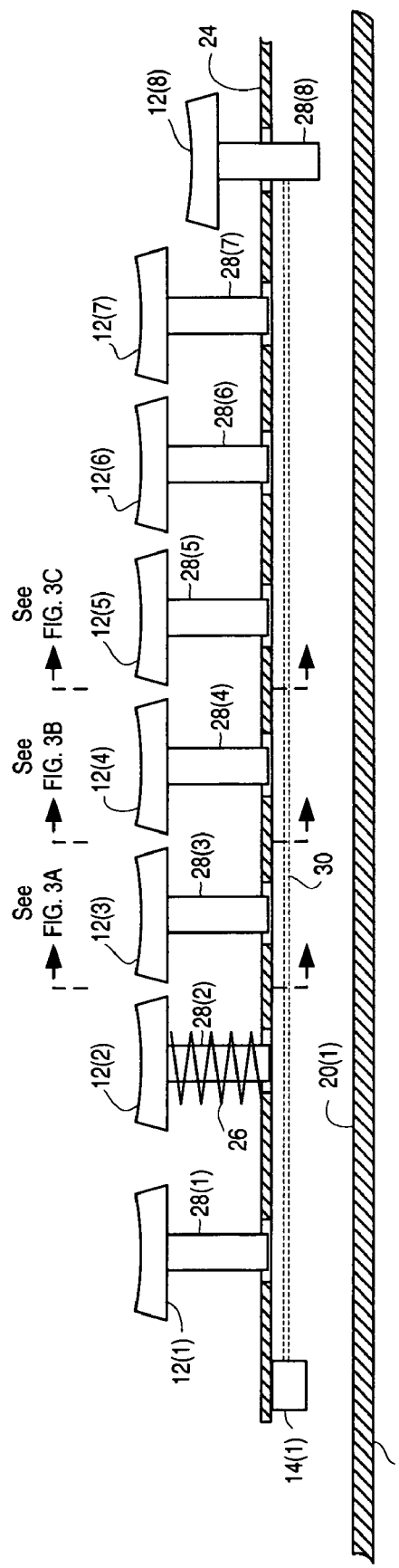
FIG. 2 is an enlarged partial sectional view of the keyboard of FIG. 1.

FIG. 2 is an enlarged partial sectional view of keyboard 10 taken along the location indicated in FIG. 1. For convenience, FIG. 2 only shows a portion of the keys in a key row. However, the remaining keys of the row are similar to keys 12(2)-12(8). Except for the number, shape and layout of keys, or as otherwise described below, the other rows of keyboard 10 are similar to the row partially shown in FIG. 2. As seen in FIG. 2, sensor 14(1) is positioned such that a beam of laser energy emanating from sensor 14(1) projects into a cavity 20(1) between upper case 24 and lower case 22. Coupled to the bottom of each key is a plunger. As used herein, "coupled" includes two components that are attached (movably or fixedly) by one or more intermediate components. In FIG. 2, each of keys 12(1)-12(8) is respectively coupled to a plunger 28(1)-28(8).

Each key is biased upward from upper case 24 by a spring 26. So as not to obscure FIG. 2, a spring 26 is only shown for key 12(2). Although FIG. 2 shows a coil spring as the biasing mechanism, other mechanisms could be used. For example, a key could be biased upward by a rubber dome having a base in contact with upper case 24 and an upper portion attached to the underside of a key. When downward force is exerted on a key in such an embodiment, the dome collapses as the key is pressed. When force is removed from the key, the dome forces the key upward.

As a key is pressed, its corresponding plunger protrudes through a hole in upper case 24 and into cavity 20(1). By way of example, FIG. 2 shows key 12(8) pressed. When a key is pressed, its plunger moves into the path of the laser beam 30 emanating from sensor 14(1). As that key continues its downward stroke, beam 30 moves across the face of the plunger in a manner described below. When that key is released, its plunger then moves upward and causes beam 30 to move across the plunger face in an opposite direction. Formed on the face of each plunger is a pattern composed of different types of surfaces. When those surfaces are struck by beam 30, and as discussed in more detail below, the output of the laser in sensor 14(1) is affected. By measuring changes in that laser output, the key that was pressed (or released) is identified.

Figure 3A:
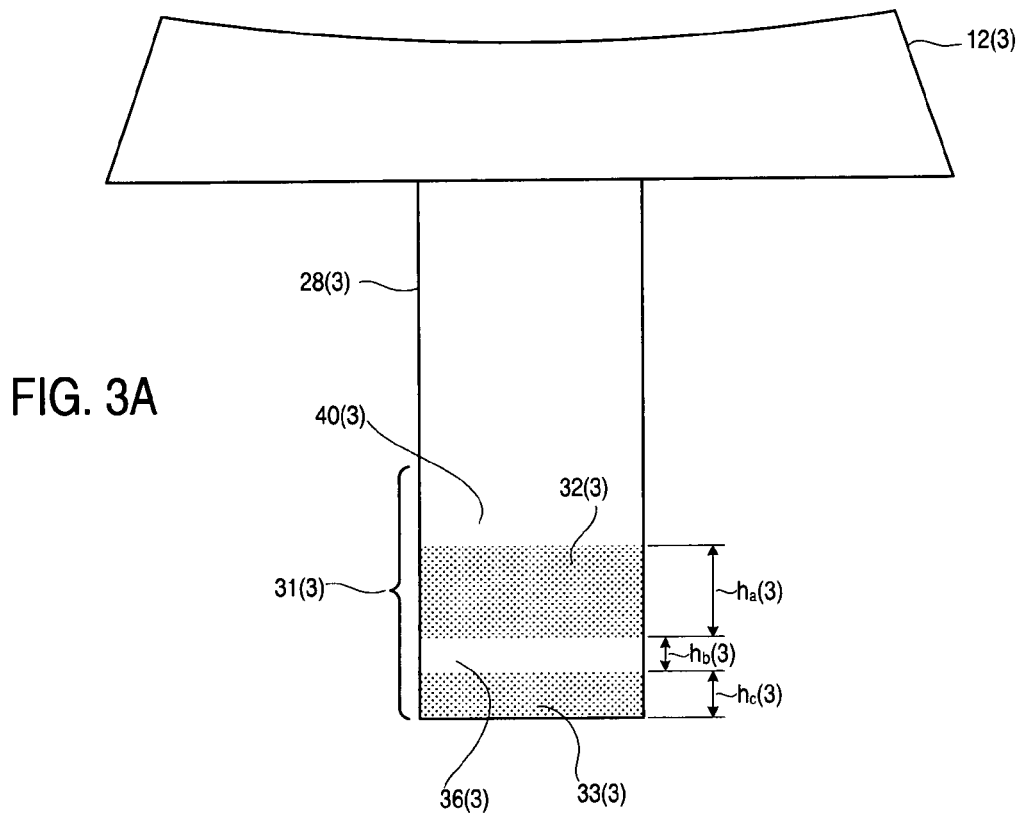
FIGS. 3A-3C are side views of three of the keys in FIG. 2.

FIG. 3A is an enlarged view, from the location shown in FIG. 2, of the face of plunger 28(3) which is struck by beam 30 when key 12(3) is depressed. As shown in FIG. 3A, that face includes a target area 31(3) having multiple speckling bands 32(3) and 33(3). Speckling bands 32(3) and 33(3) are regions of target area 31(3) which have been formed so that a known amount of speckling results when beam 30 falls on one of those bands. As is known in the art, "speckling" refers to an interference pattern which is created by random backscattering from a target surface when that target surface is struck by a beam of laser energy. Speckling is caused by microscopic surface features (e.g., roughness, texture) of the illuminated target. Although these microscopic features are randomly arranged on any given surface, such features tend to be similar for areas formed from the same type of material. For example, the density, size and reflectivity of microscopic surface features on two pieces of material X (e.g., polished aluminum) will tend to be similar. Two pieces of a different material Y (e.g., white paper) will also have surface features whose density, size and reflectivity are similar. However, the density, size and reflectivity of the material X surface features may be drastically different from those of the material Y surface features. By properly selecting material X and material Y, the speckling caused by each material is measurably different.

Bands 32(3) and 33(3) are separated by a non-speckling band 36(3). Some surfaces (e.g., highly polished reflective materials, highly absorptive materials, highly transparent materials) cause very little speckling. Non-speckling band 36(3) is formed from a material which either causes little or no speckling, or which causes substantially less speckling than bands 32(3) and 33(3). In at least some embodiments, non-speckling band 36(3) may be formed from, e.g., a mirror finish surface, transparent glass or other material, an open space, or paint that absorbs the wavelength of the laser being shined on the band. Speckling bands 32(3) and 33(3) may be formed from, e.g., wood, paper, unpolished metal, roughened plastic, or any material which is not non-speckling (or which speckles significantly more than the non-speckling band material). In some embodiments, a portion 40(3) of target area 31(3) above speckling band 32(3) may also be formed from the same non-speckling material as band 36(3).

Figure 3B:
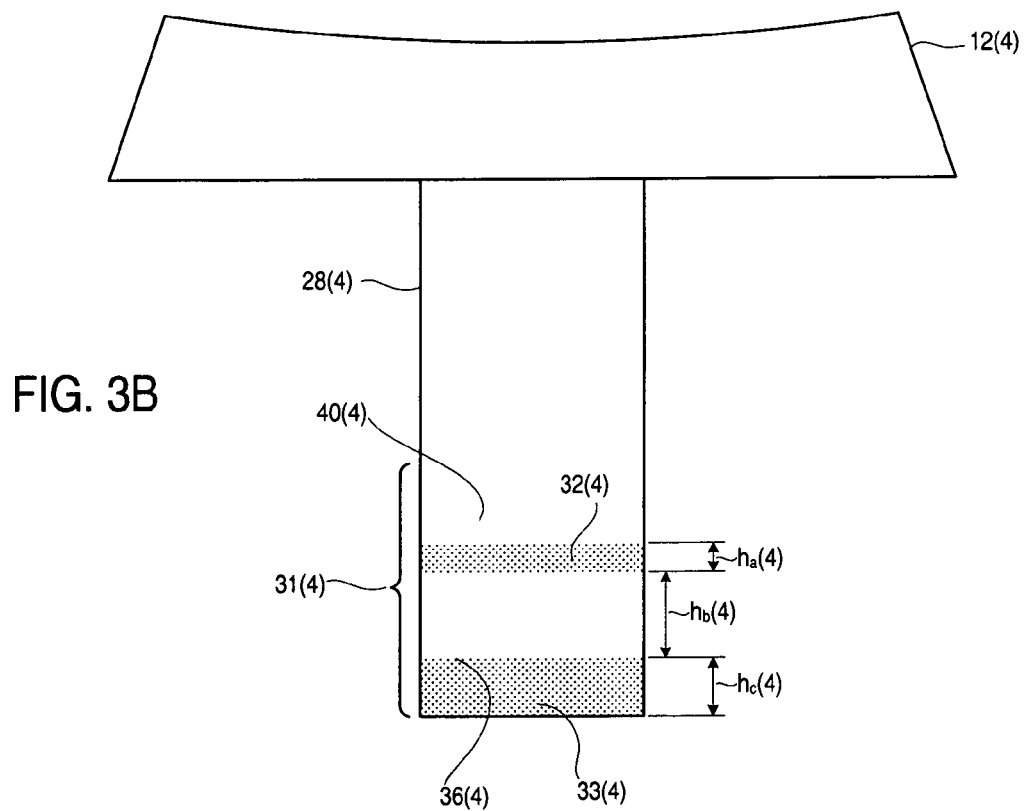
Figure 3C:
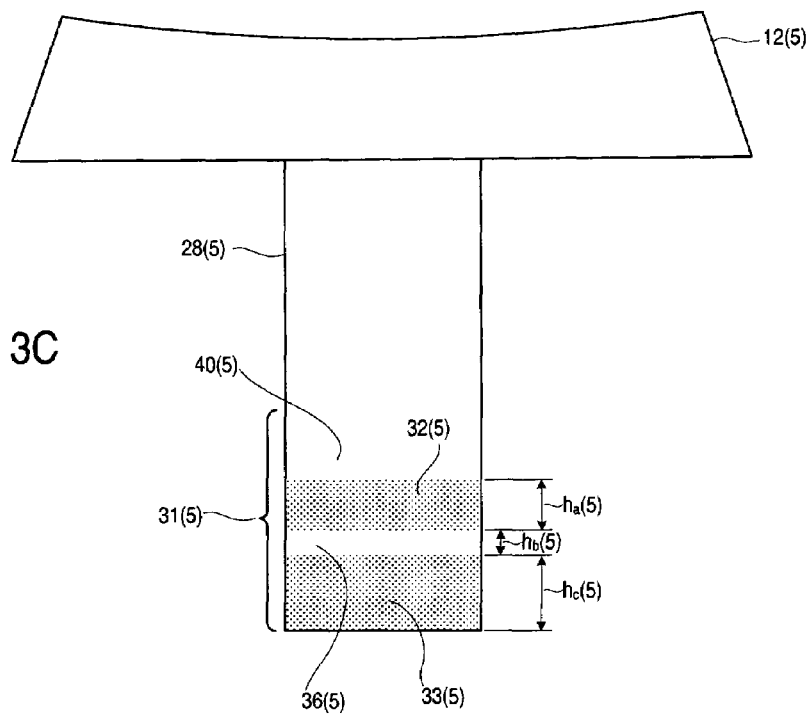

As also seen in FIG. 3A, speckling band 32(3) has a height $h_a(3)$. Similarly, non-speckling band 36(3) has a height $h_b(3)$ and speckling band 33(3) has a height $h_c(3)$. Dimensions $h_a(3)$, $h_b(3)$ and $h_c(3)$ form a pattern which, as described below, can be used to identify key 12(3). Although the target areas of other keys also include bands of speckling and non-speckling surfaces, the relative sizes of those bands are unique for each key. For example, FIG. 3B is an enlarged view, from the location shown in FIG. 2, of the face of plunger 28(4) which is struck by beam 30 when key 12(4) is depressed. The target area 31(4) of plunger 28(4) includes speckling band 32(4) having height $h_a(4)$, non-speckling band 36(4) having height $h_b(4)$ and speckling band 33(4) having height $h_c(4)$. FIG. 3C is an enlarged view, from the location shown in FIG. 2, of the face of plunger 28(5) which is struck by beam 30. Target area 31(5) includes speckling band 32(5) having height $h_a(5)$, non-speckling band 36(5)

having height $h_b(5)$ and speckling band 33(5) having height $h_c(5)$. The dimensions $h_a(3)$, $h_b(3)$, $h_c(3)$, $h_a(4)$, $h_b(4)$, $h_c(4)$, $h_a(5)$, $h_b(5)$ and $h_c(5)$, as well as similar dimension the target areas of other keys' plungers, are selected so that each target area will have a unique pattern.

Figure 4A:
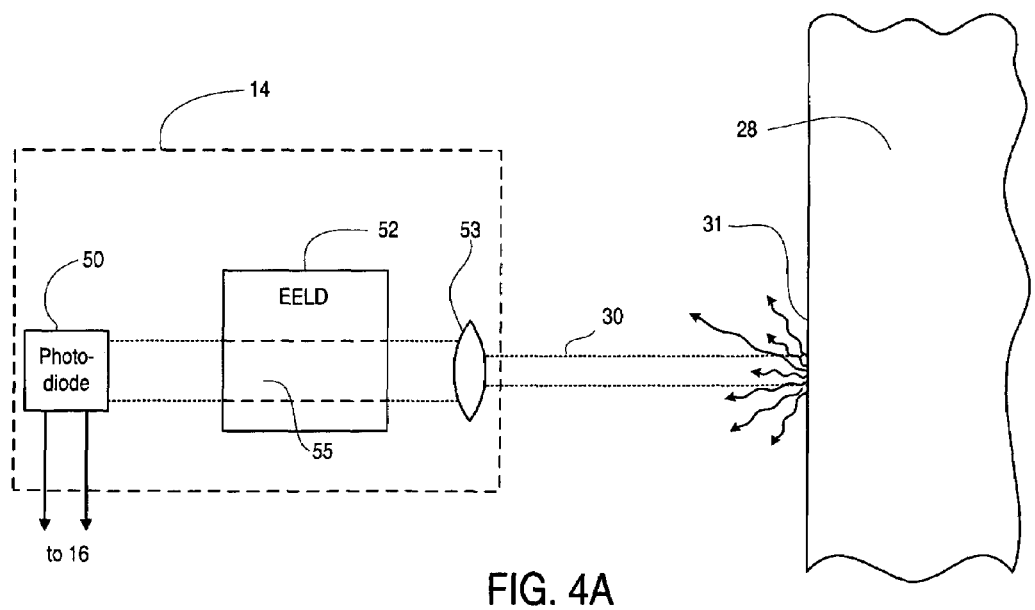
FIGS. 4A and 4B are block diagrams showing two embodiments of a speckle-modulated laser self-mixing sensor.

FIG. 4A is a block diagram schematically showing operation of a sensor 14. Sensor 14 is characteristic of each of sensors 14(1) through 14(5). Included in sensor 14 is an edge-emitting laser diode (EELD) 52, a light sensitive photodiode (PD) 50 and a lens 53. As known in the art, EELD devices emit laser energy from opposite edges. Laser light emanating from the lasing cavity 55 on one edge passes through lens 53 and into a keyboard cavity as beam 30. Laser light emanating from the other edge of EELD 52 strikes PD 50. The signal output by PD 50 varies based on the intensity of light shined on PD 50 by EELD 52. Speckling occurs when beam 30 strikes a speckling band of a target area 31 on the face of key plunger 28. A portion of the light from the speckling returns to EELD 52 and mixes with the light being generated in lasing cavity 55. This "self-mixing" causes variations in the light emitted by EELD from both edges. Because the output from both edges of EELD 52 is the same, variations in the output caused by speckle-modulated self-mixing can be measured by PD 50.

Figure 4B:
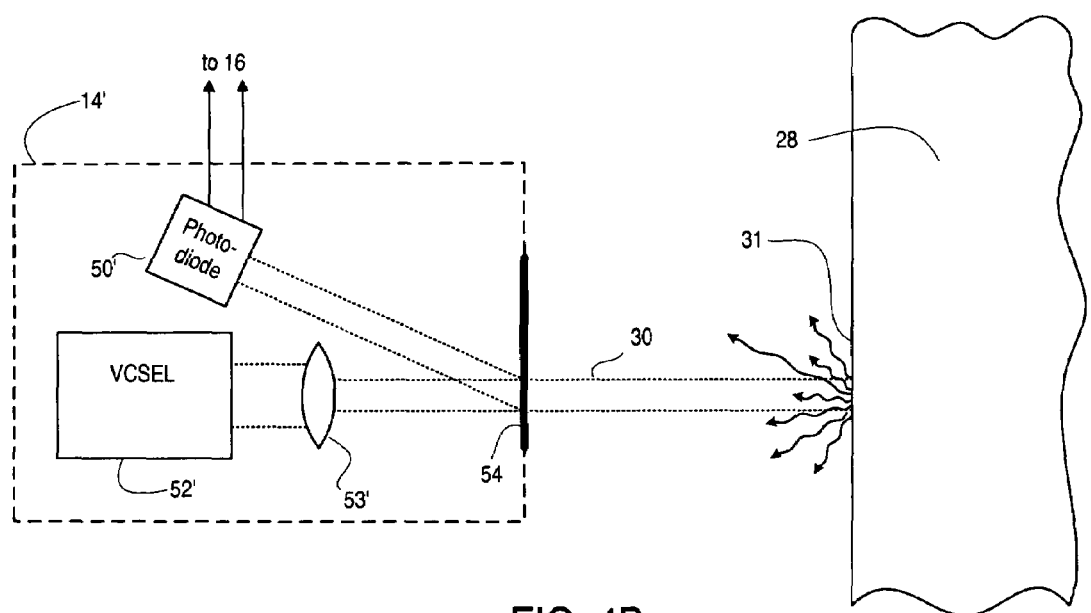

As can be appreciated by persons skilled in the art, other types of components could be used in connection with a sensor such as described in connection with FIG. 4A. For example, a phototransistor or other light sensitive element could be used instead of a photodiode. FIG. 4B is a block diagram showing one alternate embodiment of a sensor 14'. Unlike sensor 14, which employs an EELD, sensor 14' employs a vertical cavity surface emitting laser (VCSEL) 52'. Unlike an EELD, which emits laser from multiple edges, a VCSEL emits from a single side. Accordingly, a partially reflective surface 54 is placed in the path of beam 30 and directs a small portion of the beam 30 energy (e.g., approximately 5%) to PD 50'. The energy received by PD 50' is proportional to the total output of VCSEL 52', and can thus be used to measure variations in the intensity of beam 30.

Figure 5:
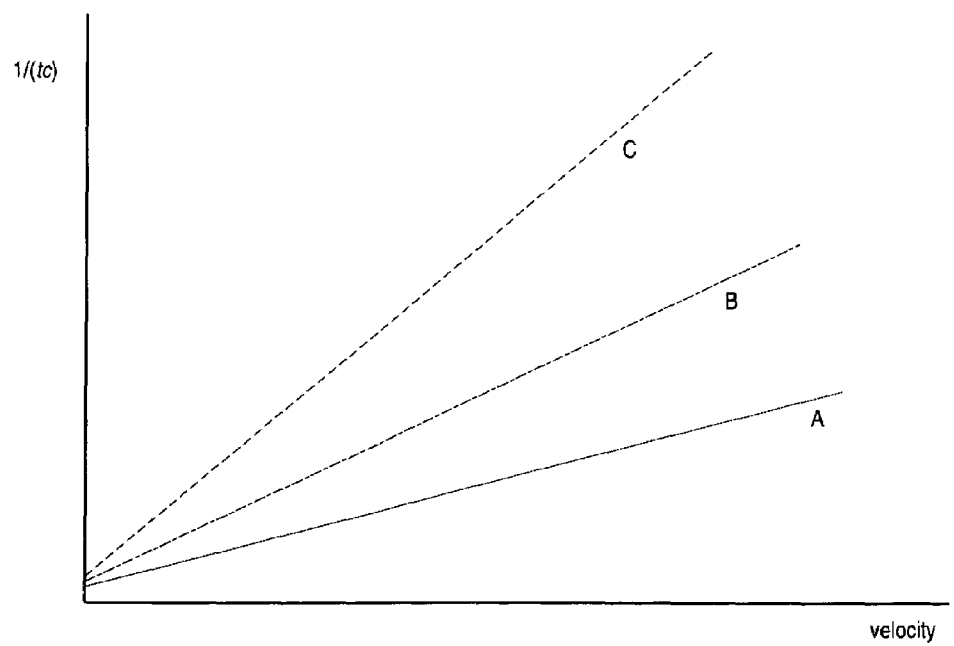
FIG. 5 is a graph showing the relationship, for three different surfaces, between movement of a laser beam across each surface and the inverse of a specified autocorrelation length.

Based on the output measured by PD 50 (or PD 50') and known characteristics of the target surface struck by beam 30, the velocity of the target surface relative to beam 30 can be calculated. Such calculation techniques are known in the art and are described in Özdemir et al., *Velocity Measurement by a Self-Mixing Laser Diode Using Speckle Correlation*, Instrumentation and Measurement Technology Conference, 1999 (IMTC/99), Proceedings of the 16th IEEE, Vol. 3, 24-26 May 1999, pages 1756-60. In particular, the output of PD 50 undergoes analog-to-digital conversion. As beam 30 moves across a speckling surface, the digitized output of PD 50 generates a waveform. This waveform is then autocorrelated and a value is determined for the autocorrelation length tc. In particular, autocorrelation length tc is the value for the autocorrelation time delay which causes the normalized autocorrelation function to drop to 1/e. For many types of speckling surfaces, the quantity 1/(tc) is a generally linear function of the speed of a laser beam across that surface. This is shown generically in FIG. 5, where 1/tc is plotted as a function of beam velocity across three types of surfaces A, B and C. The slope and vertical offset of the velocity vs. 1/(tc) line can be determined experimentally for many types of surfaces. Once the slope and vertical offset are known, an autocorrelation length value can be readily converted to a velocity.

In at least some embodiments, detection circuitry 16 performs autocorrelation upon the signals output by the PD 50 (or PD 50') from each of sensors 14(1)-14(5), and determines the autocorrelation length tc. Because the type of material used to form the speckling surfaces for each key is known, circuitry 16 then uses that tc value to determine the velocity with which a speckle-inducing surface is moving. Using that velocity and various time measurements, circuitry 16 can determine heights of specking and non-speckling bands. These heights can then be used to determine which key has interrupted a beam path and caused speckling, as well as the direction of key movement.

Figure 6:
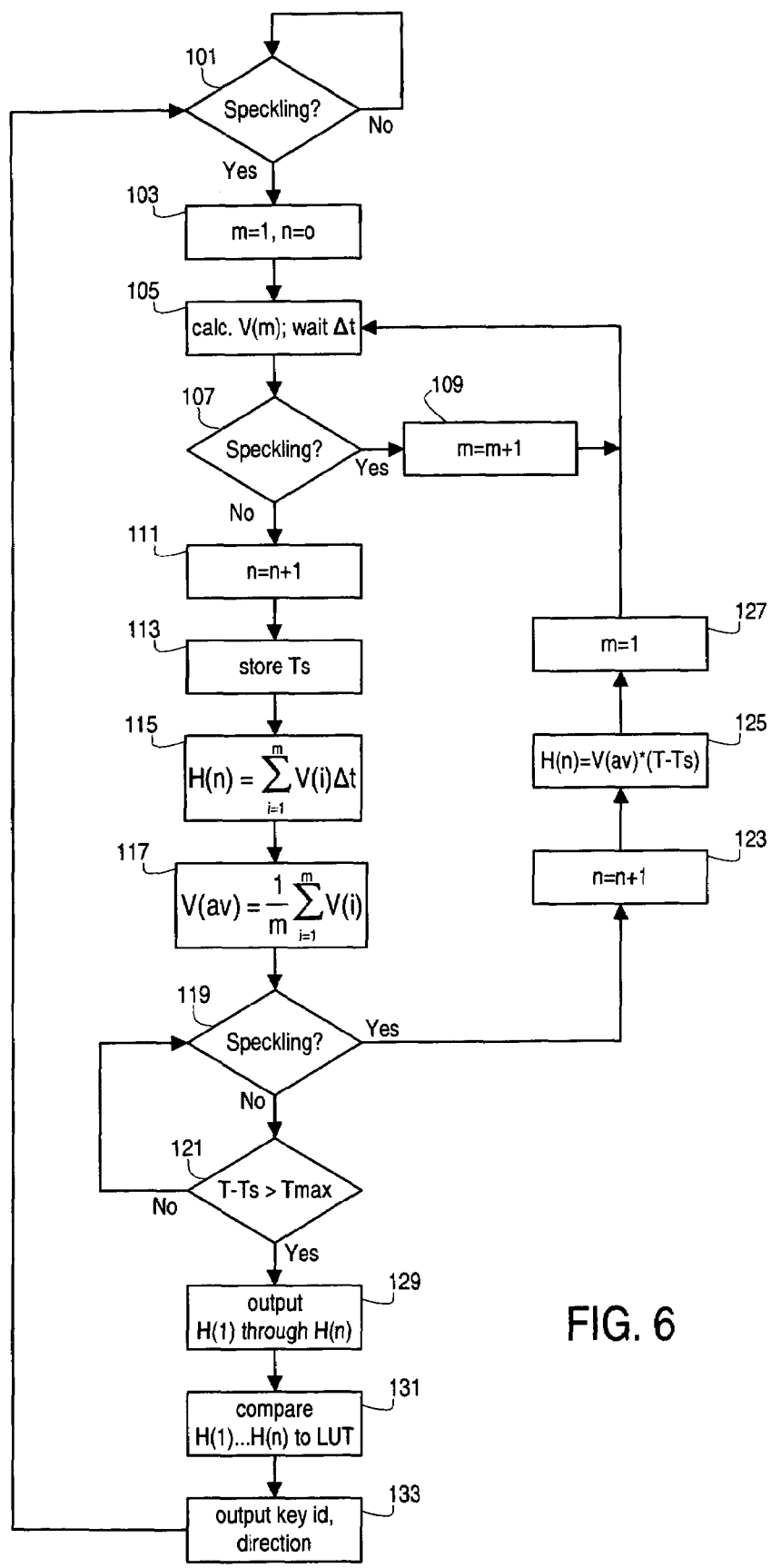
FIG. 6 is a state diagram showing at least one algorithm for identifying a moved key and the direction of movement.

FIG. 6 is a flow chart showing an algorithm, according to at least one embodiment, by which detection circuitry 16 identifies a moved key and the direction (press or release) of movement. The algorithm of FIG. 6 will be explained using a downward press of key 12(3) as shown in FIGS. 7A-7F. For simplicity, this explanation will only consider input to detection circuitry 16 from sensor 14(1). However, detection circuitry 16 operates in a similar manner in response to input from sensors 14(2)-14(5). In at least some embodiments, inputs from sensors 14(1)-14(5) are time multiplexed by detection circuitry 16.

Block 101 of FIG. 6 corresponds to an idle state of detection circuitry 16, i.e. a key is not moving up or down. While in this state, detection circuitry 16 periodically checks to determine if beam 30 is shining upon a region of a key's target area that induces speckling (e.g., speckling band 32(3) or 33(3) of key 12(3)). If the variation in the received input from sensor 14(1) (i.e., the variation in the output of PD 50) is above a threshold value, beam 30 is shining on a speckle-inducing surface. If a key has not been pressed and no speckling band from a key's target area is interrupting beam 30, the variation in the output of PD 50 is below that threshold. If speckling is not detected, the algorithm continues to loop (via the "no" branch) back to block 101.

Figure 7A:
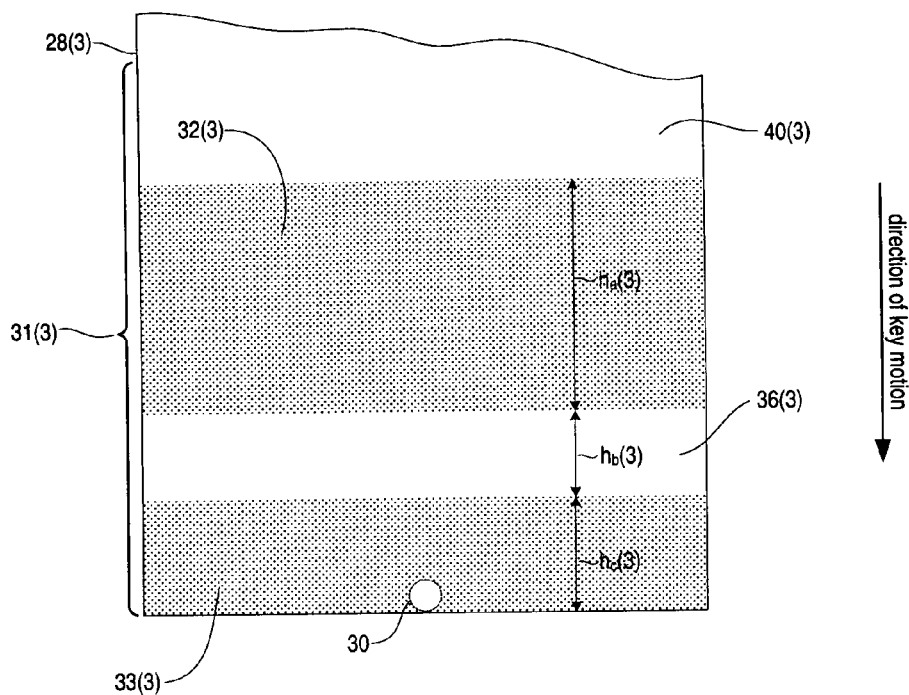
FIGS. 7A-7F show location of a laser beam upon a target, coupled to a key, as that key is being pressed.

When key 12(3) is pressed, speckling band 33(3) on the lower part of target area 31(3) begins to cross the path of beam 30, as shown in FIG. 7A (the location of beam 30 on target area 31(3) is shown with a circle). This causes the variation in the output of PD 50 to vary above the threshold value. Speckling is detected in block 101, and the algorithm of FIG. 6 thus proceeds on the "yes" branch to block 103. The values of iteration counters m and n are initialized in block 103; the purpose of these counters is explained below. The algorithm then proceeds to block 105, where detection circuitry 16 calculates a velocity V(m) of beam 30 across the target. The value of V(m) is stored, and after waiting a time period Δt, the algorithm proceeds to block 107. A value of Δt is selected, based on the sizes of beam 30 and the speckling bands of the different keys' target areas, so that a sufficient number of velocity calculations can be made as beam 30 traverses any given speckling band.

Figure 7B:
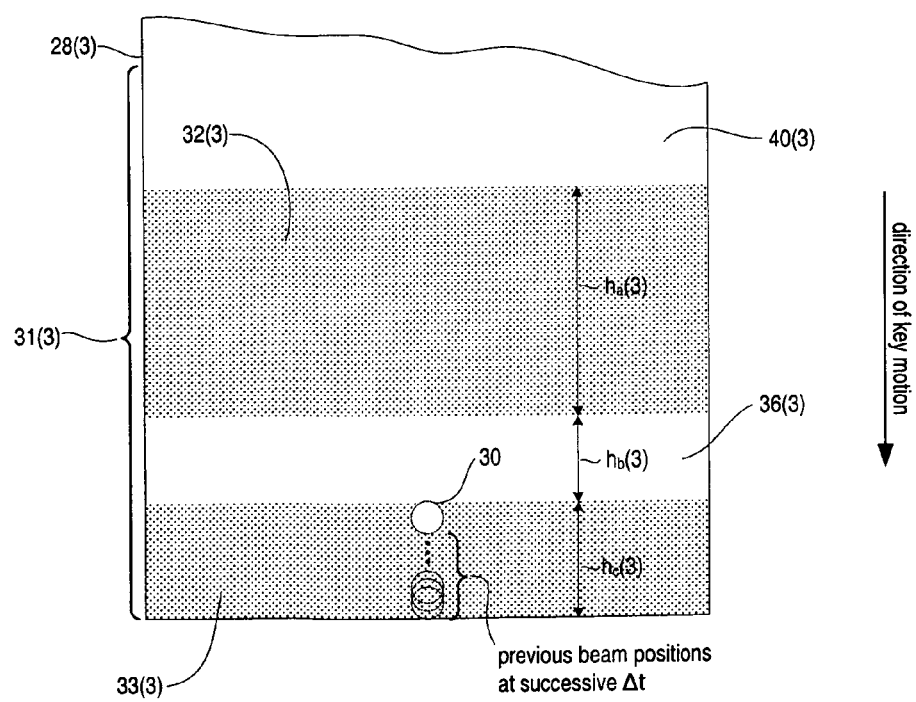

In block 107, detection circuitry 16 determines if it is still receiving sensor input indicative of speckling. If so, the algorithm proceeds on the "yes" branch to block 109 and increments the m counter by 1. The algorithm then returns to block 105, calculates another value for V(m), and waits another Δt period before proceeding again to block 107. This loop continues as long as beam 30 is striking speckling band 33(3), as shown in FIG. 7B.

Figure 7C:
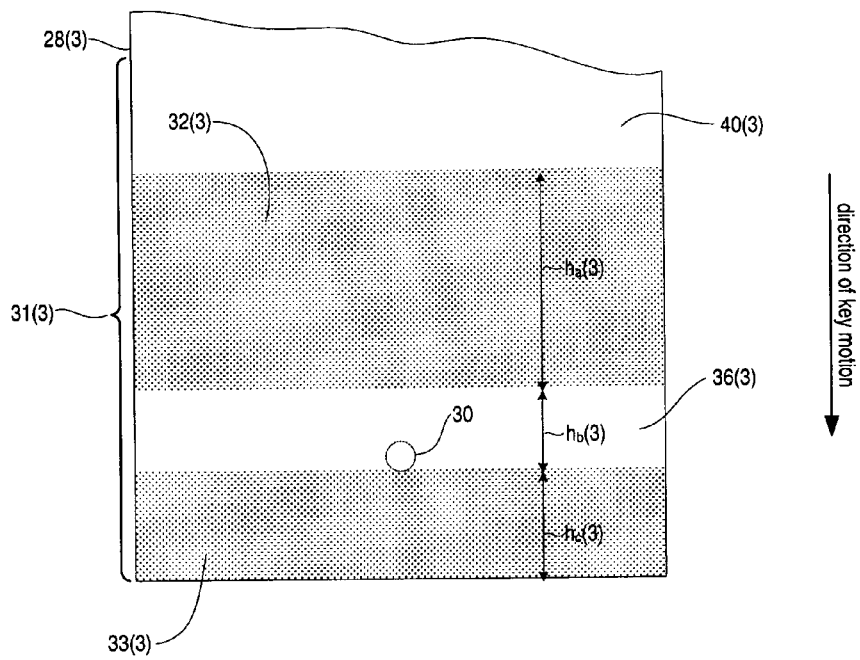

When beam 30 no longer strikes speckling band 33(3) (FIG. 7C), detection circuitry 16 ceases receiving input indicative of speckling, and the algorithm of FIG. 6 proceeds to block 111. The n counter is incremented in block 111, after which the algorithm proceeds to block 113. In block 113, a value (Ts) is stored for the time at which the speckling input ceased (i.e., when beam 30 no longer struck band 33(3), as shown in FIG. 7C). In block 115, detection circuitry 16 calculates a value H(n) for the width of the speckling band over which beam 30 just passed. In the present example, n=1 and H(1) is the sum of the V(1)*Δt+ . . . +V(m)*Δt. As seen in FIG. 7B, this is $h_c(3)$. In block 117 an average velocity V(av) for passage of beam 30 through the first speckling band is also calculated from the velocity values V(1) though V(m).

Figure 7D:
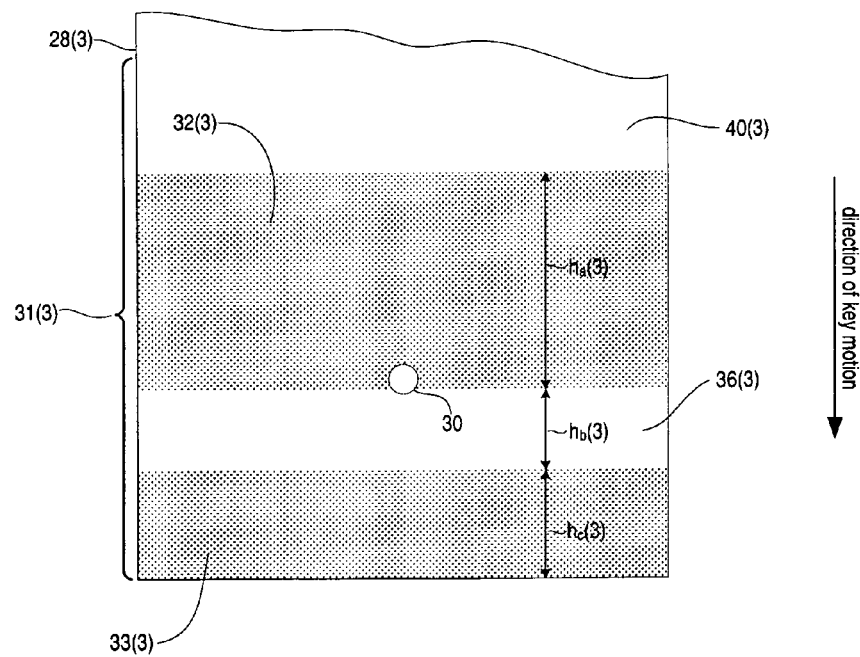
Figure 7E:
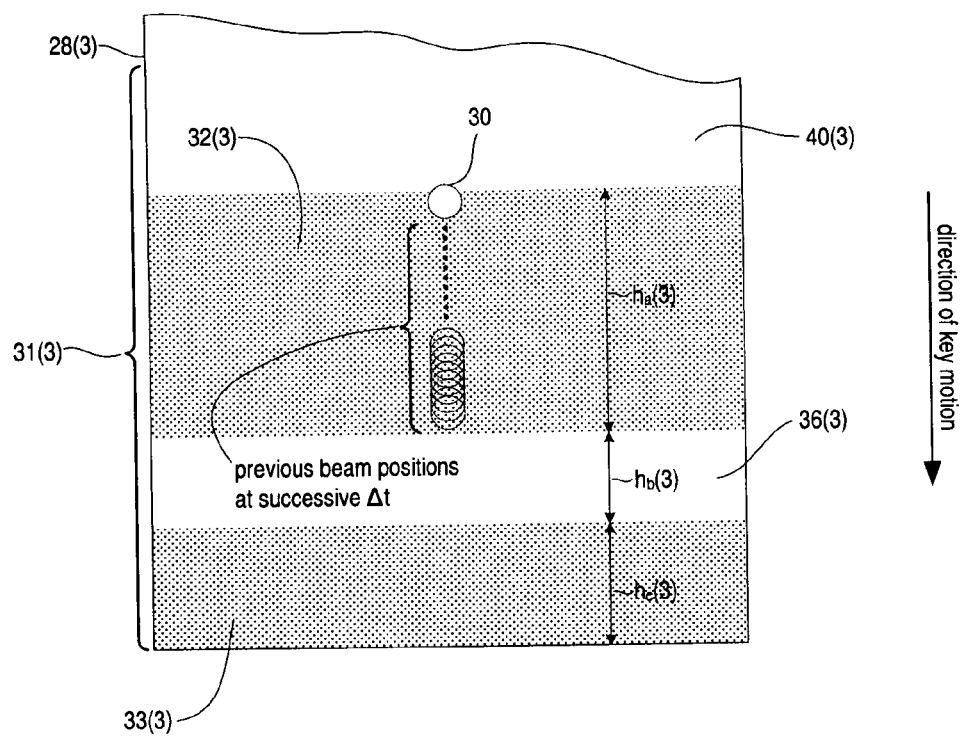

From block 117 the algorithm proceeds to block 119. In block 119, detection circuitry 16 periodically determines whether the received input from sensor 14(1) indicates that beam 30 is striking a speckling surface. If the answer is no, and as explained in more detail below, the algorithm proceeds to block 121 and determines if the time since Ts is greater than a maximum value (Tmax). If the elapsed time is not greater than Tmax, the algorithm returns to block 119. As key 12(3) continues its downward stroke, beam 30 moves across non-speckling band 36(3) into speckling band 32(3), as shown in FIG. 7D. When beam 30 strikes speckling band 32(3), the output of sensor 14(1) will again indicate speckling, and the algorithm of FIG. 6 proceeds to block 123 on the "yes" branch from block 119. At block 123, the n counter is again incremented, and another value H(n) is calculated. In block 125, H(n) (H(2) in the present example) is the height of the non-speckling region over which beam 30 just passed (in this case, band 36(3) in FIG. 7D). Because no speckling input was received while beam 30 passed over the non-speckling region, the actual velocity of beam 30 over that region is not calculated based on autocorrelation of a self-mixing waveform. Instead, the algorithm assumes that the key is being pressed (or released) with a generally constant velocity, and the height of the non-speckling region is calculated using the average velocity V(av) calculated in block 117 and the elapsed time since Ts. In the present example, H(2) is $h_b(3)$. From block 125, the algorithm moves to block 127 and resets the m counter. From block 127, the algorithm proceeds to block 105. Blocks 105 through 109 are then repeated as beam 30 moves across speckling band 32(3) (FIG. 7E).

Figure 7F:
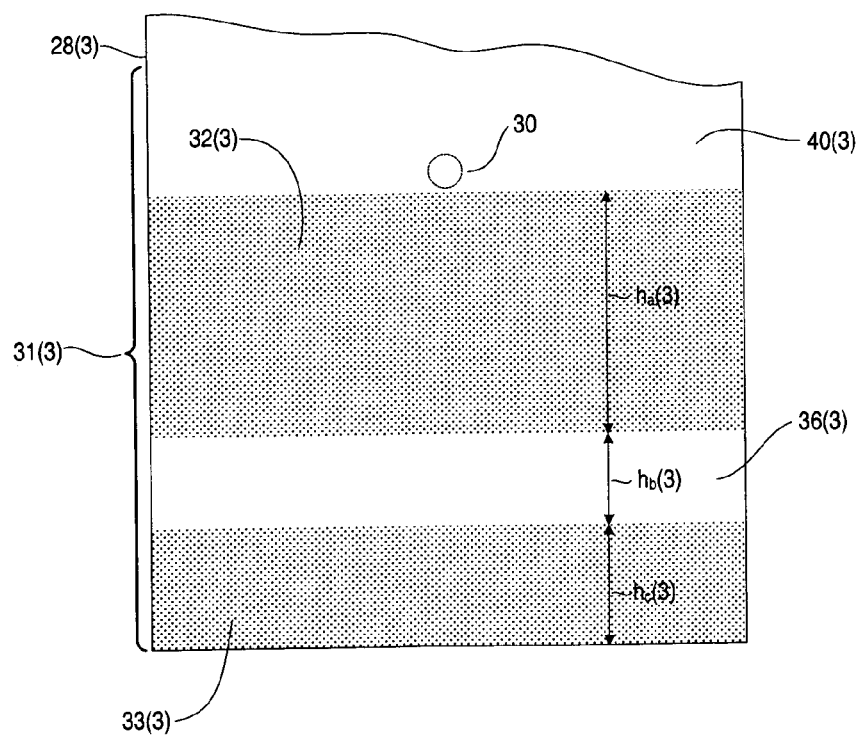

When key 12(3) is fully pressed, beam 30 comes to rest in non-speckling region 40(3), as shown in FIG. 7F. When the algorithm of FIG. 6 reaches block 119 after beam 30 reaches the position shown in FIG. 7F, sensor 14(1) output will continue to indicate no speckling. Accordingly, the algorithm will continue to loop from block 119, along the "no" branch to block 121, and back to block 119. In block 121 the algorithm determines if the elapsed time since Ts (the time at which block 113 was last entered) exceeds a Tmax. If the sensor 14(1) output does not indicate speckling for a sufficiently long time period, movement of the key has likely stopped. If the key is being pressed down (as in FIG. 7F), the beam has come to rest in a non-speckling region in the uppermost portion of the key's target. If a key has been released, no portion of that key's plunger is in the path of beam 30. In either case, a positive answer at block 121 indicates that further velocity measurement and height calculations are not needed, and the algorithm proceeds on the "yes" branch to block 129.

Figures 8A, 8B:
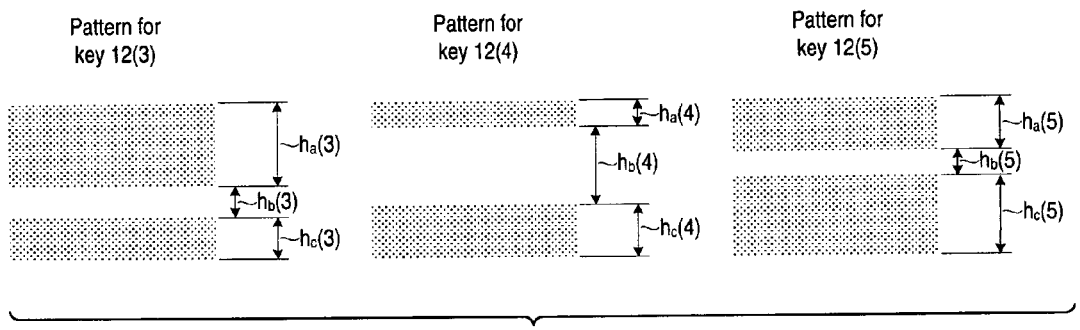
FIGS. 8A and 8B illustrate how, according to at least some embodiments, different patterns can be used to identify a pressed or released key.

In block 129, the algorithm outputs the values of H(1) through H(n). In block 131, those H(1) through (Hn) values are used to identify the moved key and to determine the direction of motion. In particular, detection circuitry 16 compares the output series of values H(1) through H(n) to values in a look-up table. Based on that comparison, the pressed key and its direction of motion (press or release) are determined. FIGS. 8A and 8B illustrate this determination. Shown in FIG. 8A are the patterns formed by the speckling and non-speckling bands on the target areas of keys 12(3), 12(4) and 12(5). FIG. 8B shows a portion of a memory-resident look-up table (LUT), corresponding to the target face patterns of FIG. 8A, which is accessed by detection circuitry 16. As seen by comparing FIG. 8A and FIG. 8B, H(1) through H(n) values of $[h_c(3); h_b(3); h_a(3)]$ correspond to key 12(3) being pressed, while H(1) through H(n) values of $[h_a(3); h_b(3); h_c(3)]$ correspond to key 12(3) being released. H(1) through H(n) values of $[h_c(4); h_b(4); h_a(4)]$ correspond to key 12(4) being pressed, while H(1) through H(n) values of $[h_a(4); h_b(4); h_c(4)]$ correspond to key 12(4) being released. H(1) through H(n) values of $[h_c(5); h_b(5); h_a(5)]$ correspond to key 12(5) being pressed, while H(1) through H(n) values of $[h_a(5); h_b(5); h_c(5)]$ correspond to key 12(5) being released. FIGS. 8A and 8B only show the speckling/non-speckling band patterns for 3 keys. However, each of the other keys in keyboard 10 also has a unique pattern of speckling/non-speckling bands, and the order of those band widths corresponding to each key is stored in the LUT.

Returning to FIG. 6, the algorithm outputs an identification of the moved key and the direction of motion in block 133. From block 133, the algorithm then returns to block 101 to await another key movement.

In the embodiment of FIGS. 6-7F, beam 30 may in some cases lie along a boundary between speckling and non-speckling bands. In such an instance, the speckle-modulated frequency in the power output of the laser would not change substantially. The amplitude of that signal may vary, however, as only a portion of the surface in the spot of beam 30 is contributing to self-mixing. In some embodiments, this amplitude information is used to quantify the transition region. In still other embodiments, a transmissive material is used for non-speckling regions, and a photo receptor is positioned opposite the laser sensor on the other side of the key. Based on the amount of light detected by the sensor, the degree to which beam 30 is between speckling and non-speckling bands could be detected.

The embodiment described in connection with FIGS. 6-7F may be subject to certain constraints. As previously indicated, each key's pattern should be unique. Although target area patterns of two separate keys may both include a specking band of the same height, the other bands of those two keys should be of different heights and/or in a different arrangement. In order to determine direction of key movement using the algorithm of FIG. 6, each key's target pattern should be vertically asymmetric. In other words, the series $[h_a(s); h_b(s); h_c(s)]$ for a key s should not be the same as $[h_c(s); h_b(s); h_a(s)]$. The non-speckling band should also be appropriately sized relative to the speckling bands. In particular, the speckling band heights should not be so small so as to prevent obtaining a reasonable V(av) value for use when calculating height of a non-speckling band.

In other embodiments, one or more of these constraints may not apply. For example, vertically symmetric target area patterns are used in some embodiments. Instead of determining whether a key is being pressed or released based on the order in which various band heights occur, detector 16 simply stores a flag for each key indicating whether the key is up or down. If motion of a key is detected while the flag for that key indicates the key is already pressed, the flag is changed to indicate the key has been released. Conversely, detection of motion for a key having a "released" flag value will cause that value to be changed to "pressed." In still other embodiments, some or all target area patterns may be repeated, with keys detected by a single sensor having unique patterns. Referring to FIG. 1, one such embodiment could be implemented by assigning unique patterns for all of the keys in the row aligned with sensor 14(1), but then reusing some or all of those patterns in the rows aligned with other sensors. If a shared pattern is detected, detection circuitry 16 identifies the moved key based on the sensor which sensed the movement.

Figure 9A:
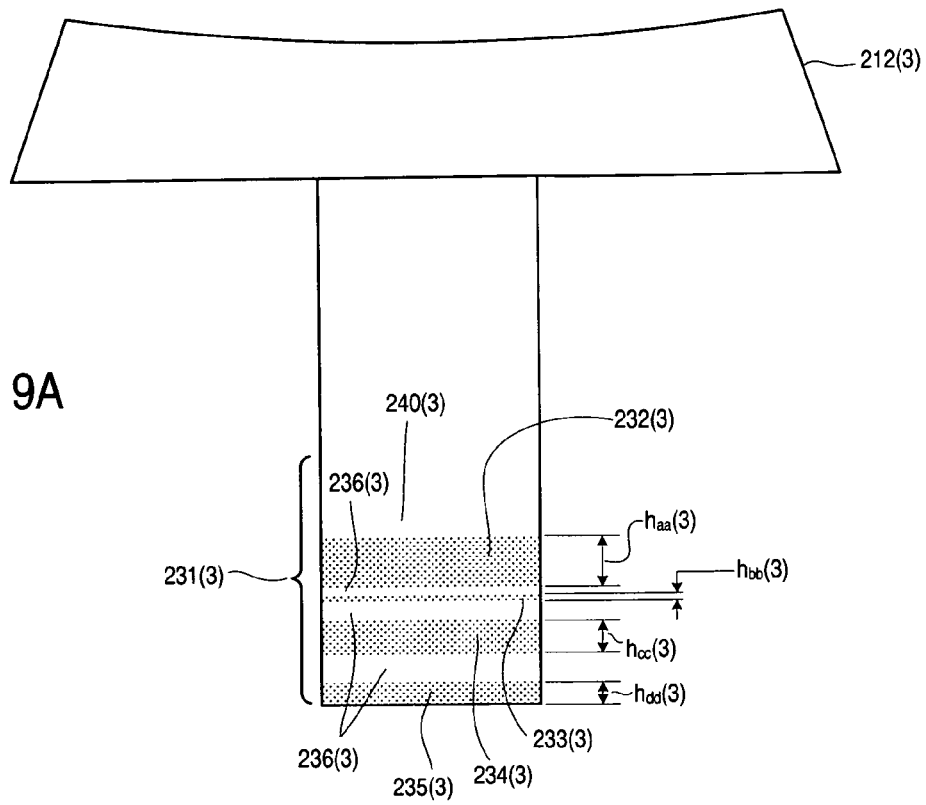
FIGS. 9A-9C show key targets according to at least some additional embodiments.
Figure 9B:
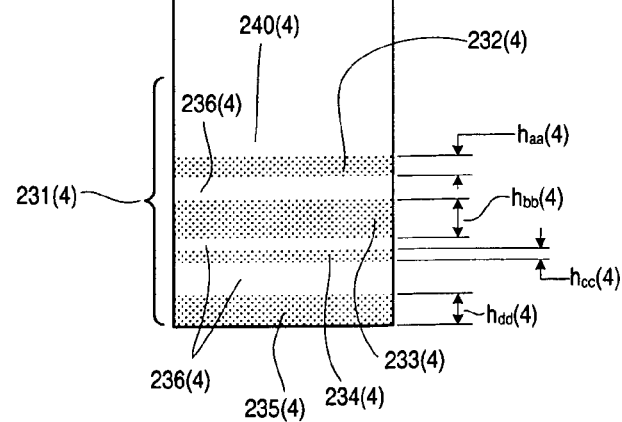
Figures 9C, 11:
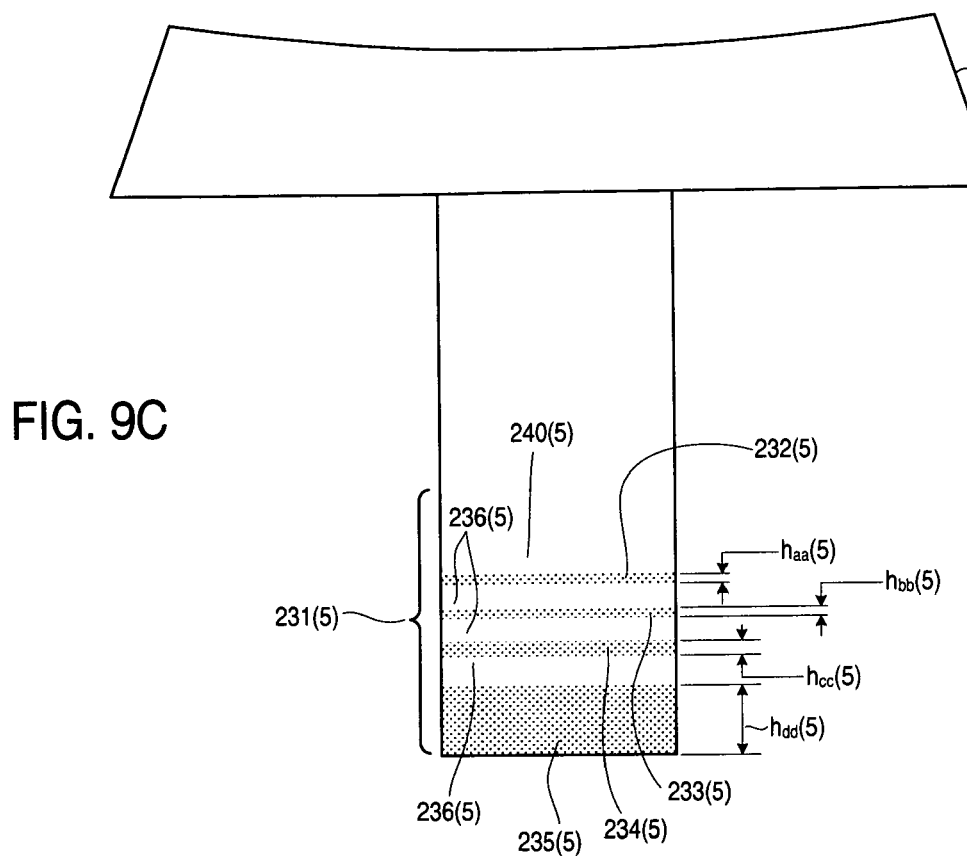
FIG. 11 illustrates a look-up table according to another embodiment.

Three examples of key target area patterns in yet an additional embodiment are shown in FIGS. 9A-9C. FIG. 9A shows a key 212(3) having a target area 231(3) with speckling bands 232(3), 233(3), 234(3) and 235(3) having heights $h_{aa}(3)$, $h_{bb}(3)$, $h_{cc}(3)$ and $h_{dd}(3)$, respectively. The speckling bands are separated by non-speckling bands 236(3), and an additional non-speckling region 240(3) is located at the top of the pattern. FIG. 9B shows a key 212(4) having a target area 231(4) with speckling bands 232(4), 233(4), 234(4) and 235(4) having heights $h_{aa}(4)$, $h_{bb}(4)$, $h_{cc}(4)$ and $h_{dd}(4)$, respectively. The speckling bands are separated by non-speckling bands 236(4), and an additional non-speckling region 240(4) is located at the top of the pattern. FIG. 9C shows a key 212(5) having a target area 231(5) with speckling bands 232(5), 233(5), 234(5) and 235(5) having heights $h_{aa}(5)$, $h_{bb}(5)$, $h_{cc}(5)$ and $h_{dd}(5)$, respectively. The speckling bands are separated by non-speckling bands 236(5), and an additional non-speckling region 240(5) is located at the top of the pattern.

Figure 10:
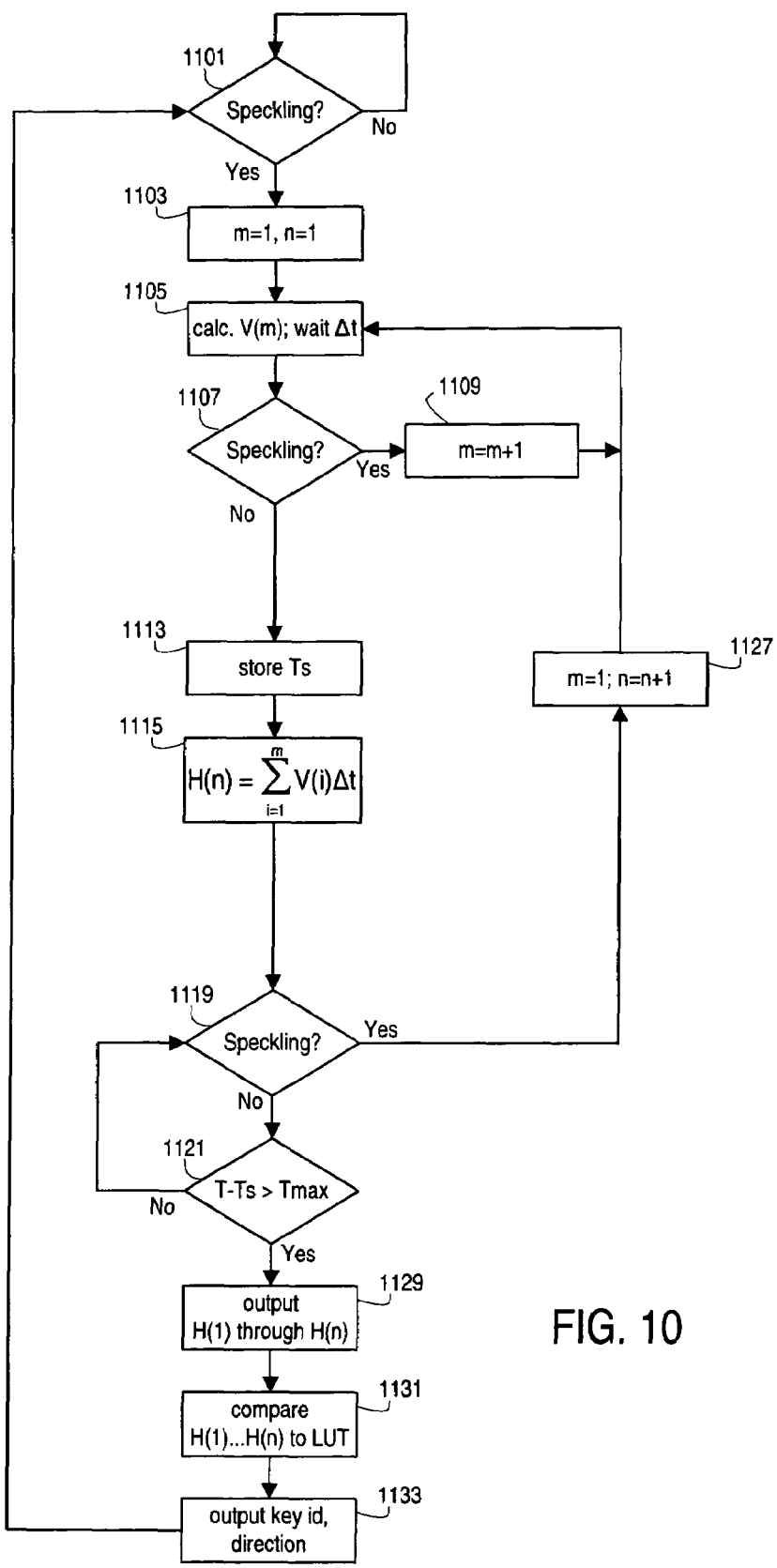
FIG. 10 is a state diagram showing an algorithm, according to another embodiment, for identifying a moved key and the direction of movement.

In the embodiment of FIGS. 9A-9C, the heights of the non-speckling bands are not used as part of each key's unique pattern. Instead, non-speckling bands are simply used as delimiters between speckling bands, and each key's pattern is based solely on the heights of the speckling bands. FIG. 10 is a flow chart for an algorithm in which a moved key is identified and the direction of motion determined for the embodiment of FIGS. 9A-9C. Blocks 1101, 1105, 1107, 1109, 1113, 1115, 1119, 1121, 1129, 1131 and 1133 are respectively similar to blocks 101, 105, 107, 109, 113, 115, 119, 121, 129, 131 and 133 in FIG. 6. Block 1103 is similar to block 103, except that counters m and n are initialized slightly differently. Block 1127 is similar to blocks 123 and 127. As can be seen by comparing FIGS. 6 and 10, the algorithms are similar. However, the algorithm of FIG. 10 omits steps in which an average velocity or non-speckling band height is calculated.

FIG. 11 shows a LUT which includes pattern data for keys 212(3) through 212(5) in the up and down directions. As seen by comparing FIG. 11 with FIGS. 9A-9C, only the heights of the speckling bands are used for identification. The heights of the non-speckling bands are not calculated.

As seen in FIG. 2, it is in some cases possible for one key to mask the press (or release) of another key under certain circumstances. For example, a press or release of key 12(5) will not be detected by sensor 14(1) if key 12(4) is in a down (i.e., pressed) condition. Accordingly, a press of key 12(5) followed by a subsequent press of key 12(4) could mask release of the key 12(5). This problem can be addressed in various manners. For many keys (e.g., keys corresponding to letters), simultaneous pressing is extremely rare. For keys that are unlikely to be intentionally pressed simultaneously, firmware in detection circuitry 16 is configured to treat a press of key 12(4) while key 12(5) is down as a release of key 12(5). The actual releases of keys 12(4) and 12(5) (if detected) are then ignored. This will simply result in a mistyped word or other type of behavior readily recognized by the user, and the user will know to retry the desired key.

Other masking combinations can be addressed in similar ways. For instance, the pressing of a key might be masked, but release of that key might be detectable. Referring again to FIG. 2 for an example, key 12(5) might be pressed while key 12(4) is a down condition. In such a circumstance, sensor 14(1) would not detect the press of key 12(5). If the user then releases key 12(4) before releasing 12(5), the release of key 12(5) would be detectable. Some software applications could behave unpredictably if a signal is received indicating release of a key which has not previously been indicated as pressed. In at least some embodiments, detection circuitry 16 or microprocessor 18 maintains a table noting the condition (pressed/unpressed) for each maskable key. If release is detected for a key which is already noted as "unpressed," the release is simply ignored (e.g., no signal regarding the release is transmitted to the computer to which the keyboard is connected).

Figure 12:
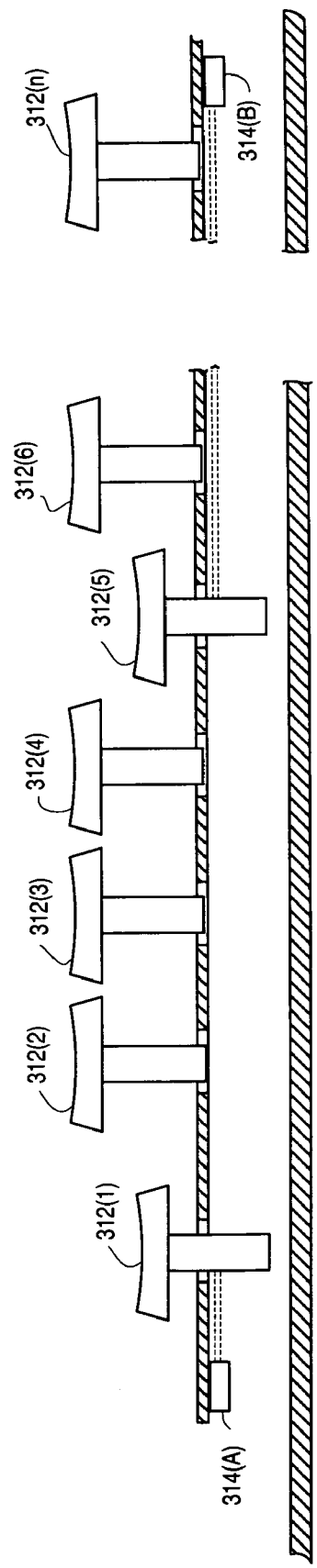
FIG. 12 shows detection of simultaneous key presses in the same row according to at least some embodiments.

In some cases, it may be desirable to detect multiple presses or releases of keys within a single row. In some embodiments, a user could be required to press keys sequentially in a particular order (e.g., first pressing a key furthest away from a sensor followed by a key closer to a sensor), and to release in a particular order (e.g., releasing the closer key then releasing the further key). In still other embodiments, simultaneous key presses in the same row can be detected. For example, FIG. 12 shows a row similar to that of FIG. 2, and including keys 312(1)-312(n). Although not seen in FIG. 12, sensors 314(A) and 314(B) are also offset from each other in the horizontal direction so as to avoid shining into each other's lasing cavities. In this embodiment, sensors 314(A) and 314(B) on opposite ends of the row transmit parallel beams of laser energy within the cavity under keys 312(1)-312(n). Identical targets are included on two sides of each key plunger. In this manner, each key within the row can be detected by either of sensors 314(A) or 314(B). Thus, and as seen in FIG. 12, presses of two keys (312(1) and 312(5) in the present example) can be simultaneously detected. If a third or subsequent key is pressed so as to cause masking (e.g., key 312(4) or key 312(6)), such masking can be addressed in the manner previously described for rows with a single sensor.

Figure 13A:
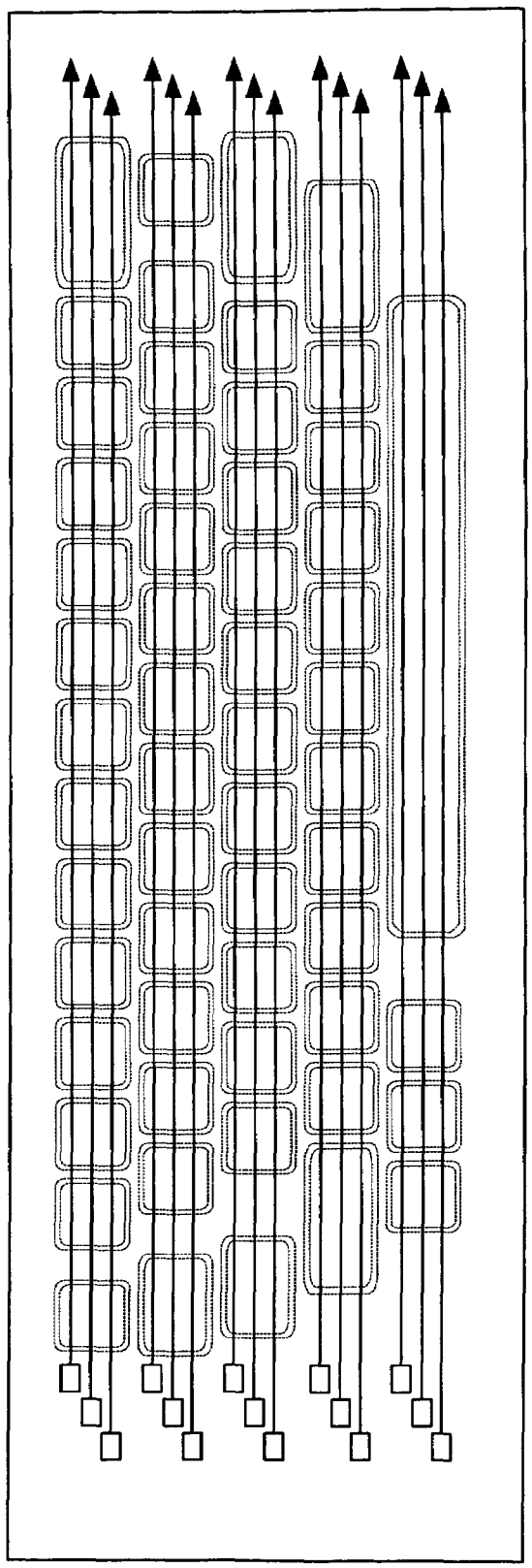
FIG. 13A shows arrangement of key detection sensors according to an additional embodiment.
Figure 13B:
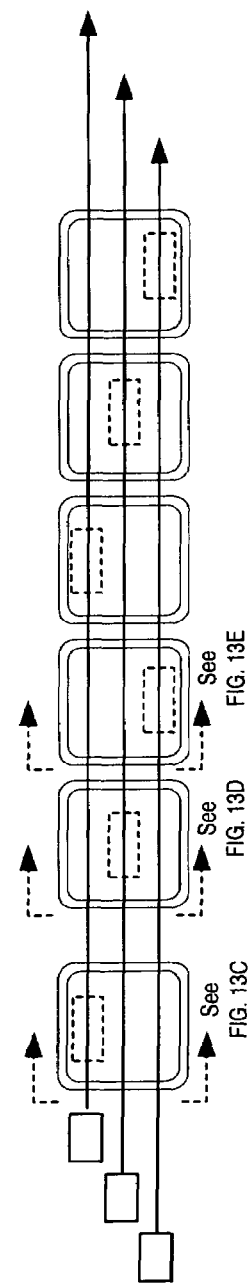
FIG. 13B-E shows arrangement of key targets according to additional embodiments.
Figure 13C:
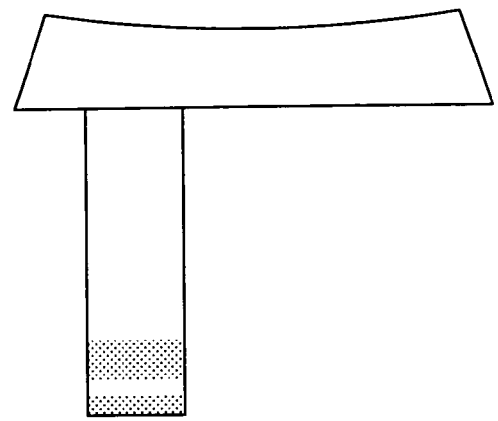
Figure 13D:
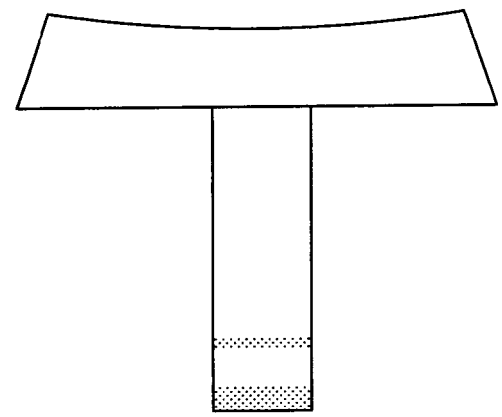
Figure 13E:
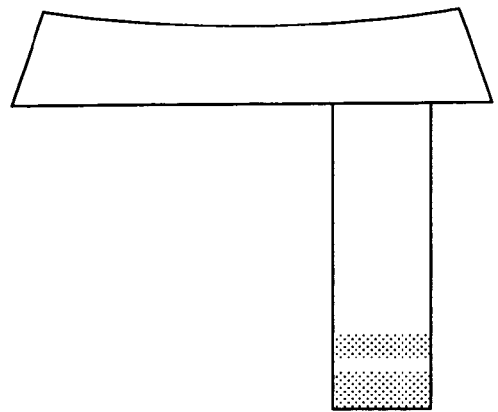
Figure 14:
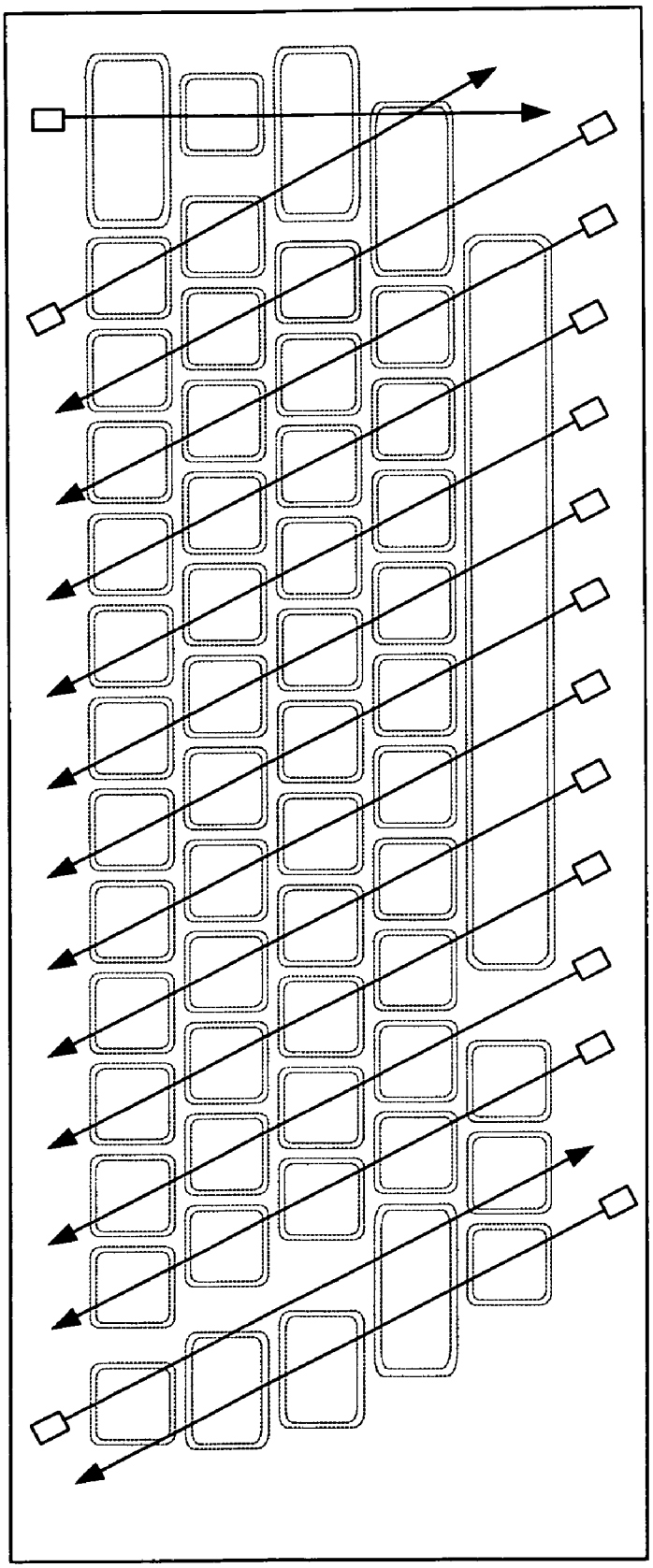
FIG. 14 shows arrangement of key detection sensors according to an additional embodiment.

FIG. 13A shows an embodiment in which there are three sensors per row. In such an embodiment, keys of a row can have targets which are laterally offset from one another, as shown in FIGS. 13B-E. In yet other embodiments, and as shown in FIG. 14, sensors can be distributed along key columns. Each column could have one, two or more sensors, and could have sensors positioned at the top and/or bottom of the column.

Figure 15:
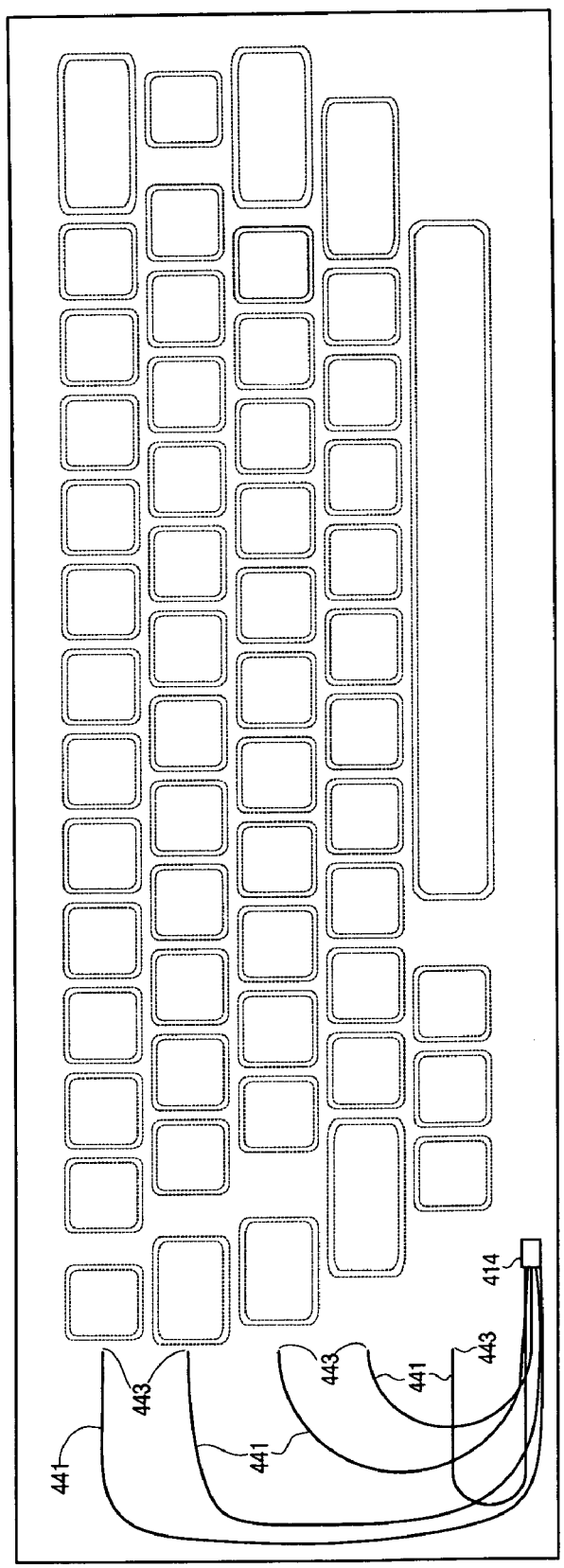
FIG. 15 shows a laser diode coupled to optical fibers, according to at least some embodiments, so as to form multiple key detection sensors.

In still other embodiments, a single laser diode can be used to implement multiple sensors. As shown in FIG. 15, a single laser diode 414 is optically coupled to a plurality of optical fibers 441. Laser energy emanates from the ends 443 of fibers 441. When a target is in the path of that energy, speckle from that target returns into the fiber. By knowing which fiber received speckle return, the target can be identified. The determination of the receiving fiber can be performed in various manners. In at least some embodiments, each fiber is optically coupled to one or more digital micromirror devices acting as shutters for each fiber. These shutters open and close according to a known schedule, and the receiving fiber can be determined by reference to that schedule. In other embodiments, each fiber coupled to a laser diode is sized such that a known (and different) frequency shift is added to the signal generated by laser 414.

Figure 16A:
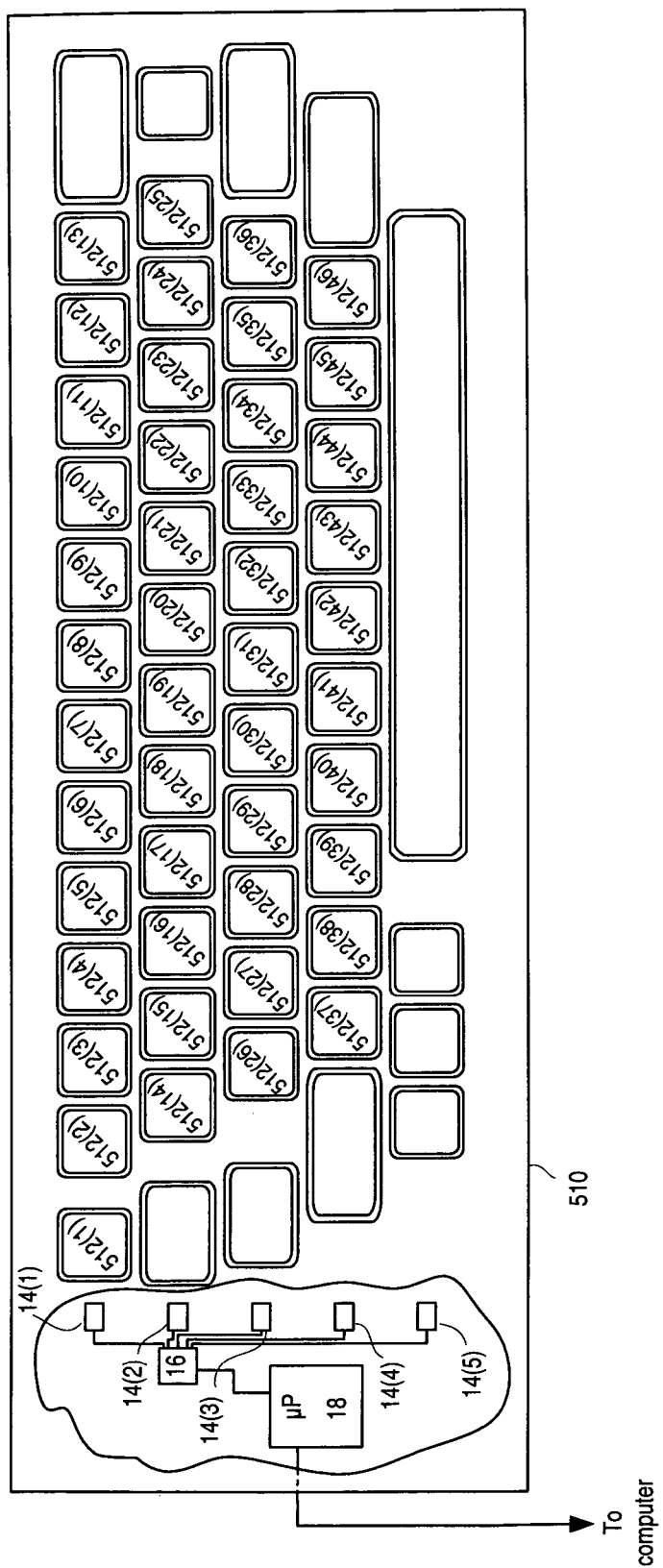
FIGS. 16A and 16B show rearrangement of keys according to at least some embodiments.
Figure 16B:
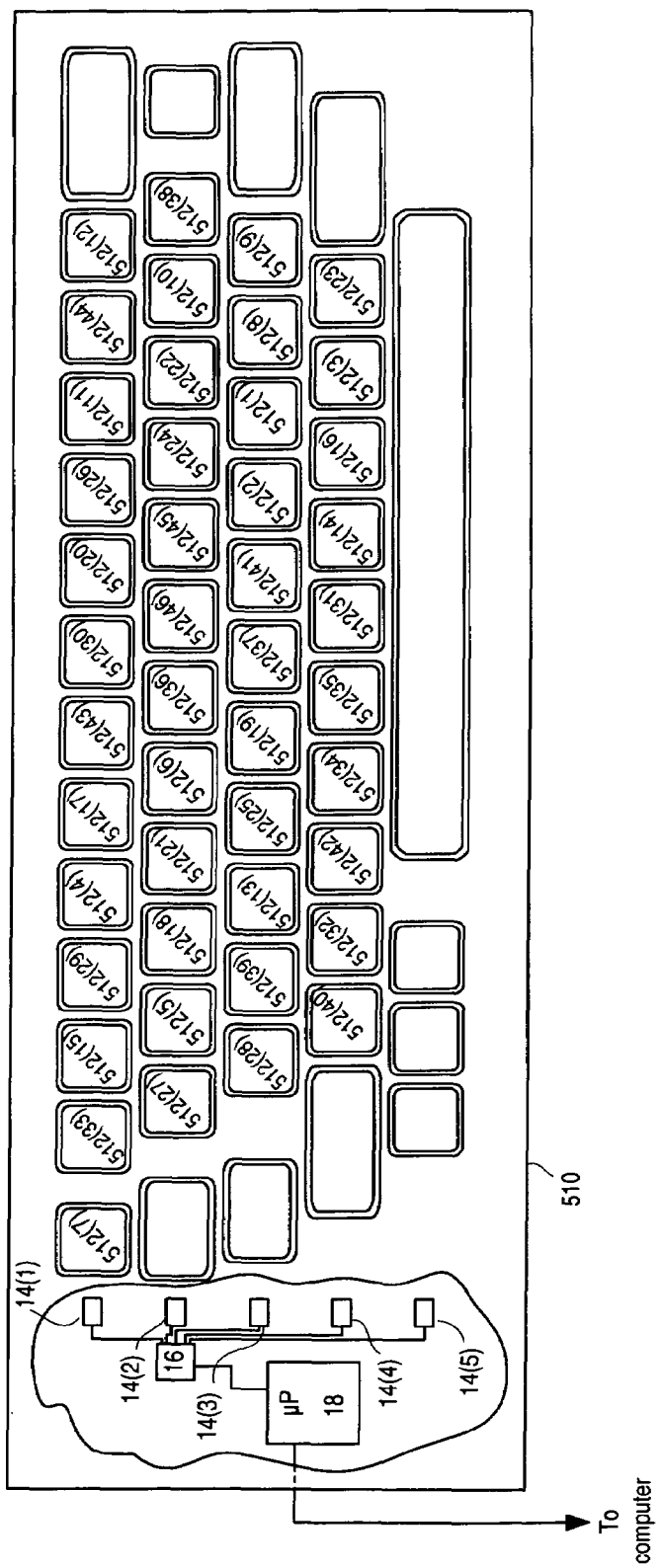

FIGS. 16A and 16B illustrate at least one advantage that may be realized by certain embodiments. In FIG. 16A, each of keys 512(1) through 512(46) has a unique target area pattern on its corresponding plunger. The plungers and target areas are not shown in FIG. 16A, but are similar to those previously described. Because each of these keys has a unique target, correctly identifying a press or release is not dependent upon which of sensors 14(1) through 14(5)

detects key motion. Accordingly, and as shown in FIG. 16B, the keys can be rearranged into any desired configuration. This would, for example, allow reconfiguration of a single keyboard for use with a different language.

Figure 17A:
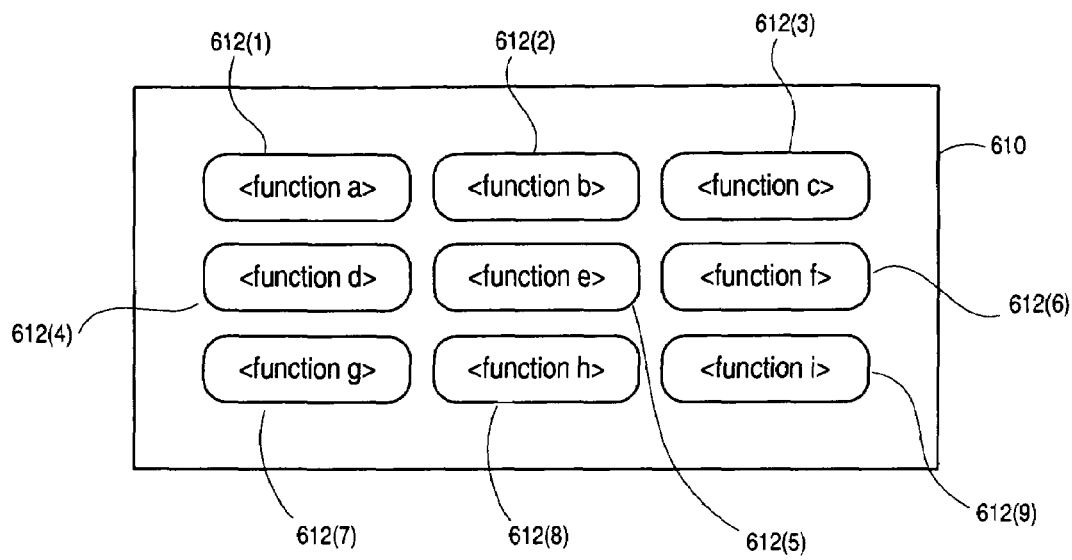
FIGS. 17A and 17B show an input device, according to at least some embodiments, in which control pieces may be removed and replaced with control pieces assigned different functions.
Figure 17B:
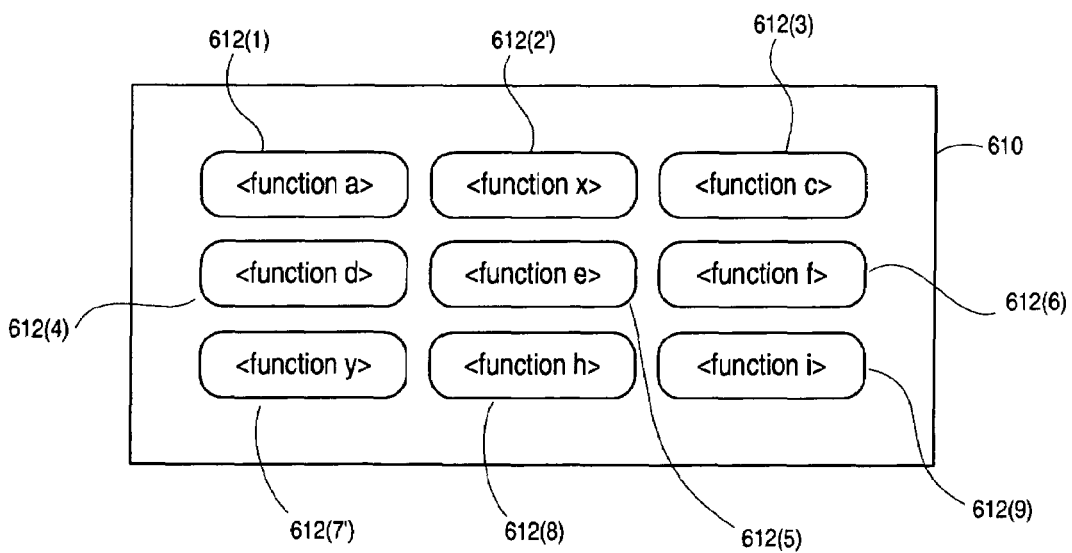

FIGS. 17A and 17B show an input device, according to at least some embodiments of the invention, in which control pieces may be removed and replaced with control pieces assigned different functions. Shown in FIG. 17A is an input device 610 having multiple control pieces 612(1) through 612(9). Control pieces 612(1) through 612(9) can be keys similar to those used on a keyboard, push buttons, or other type of user-manipulatable controls. Although not shown, each control piece has a plunger with a unique pattern on a target area of the plunger. Using laser sensors (not shown) and detection circuitry (also not shown) similar to that previously described in connection with other embodiments, the press or release of each key is detected. Each key has an associated function, shown generically in FIG. 17A as "<function a>," etc. A function could be a character, a specific command, etc. For example, input device 610 could be a game controller, with each function corresponding to a command specific to a particular game.

FIG. 17B shows input device 610 after some of the control pieces have been replaced. Specifically, control piece 612(2) has been replaced with control piece 612(2') and control piece 612(7) replaced with control piece 612(7'). By replacing control piece 612(2) with piece 612(2'), <function b> has been replaced with <function x>. Similarly, replacing control piece 612(7) with piece 612(7') has replaced <function g> with function <function y>. Based on unique patterns for pieces 612(2') and 612(7'), dedicated keys for these new functions can be readily added. Returning to the example of a game controller, <function x> and <function y> may correspond to commands specific to a different game.

Figure 18A:
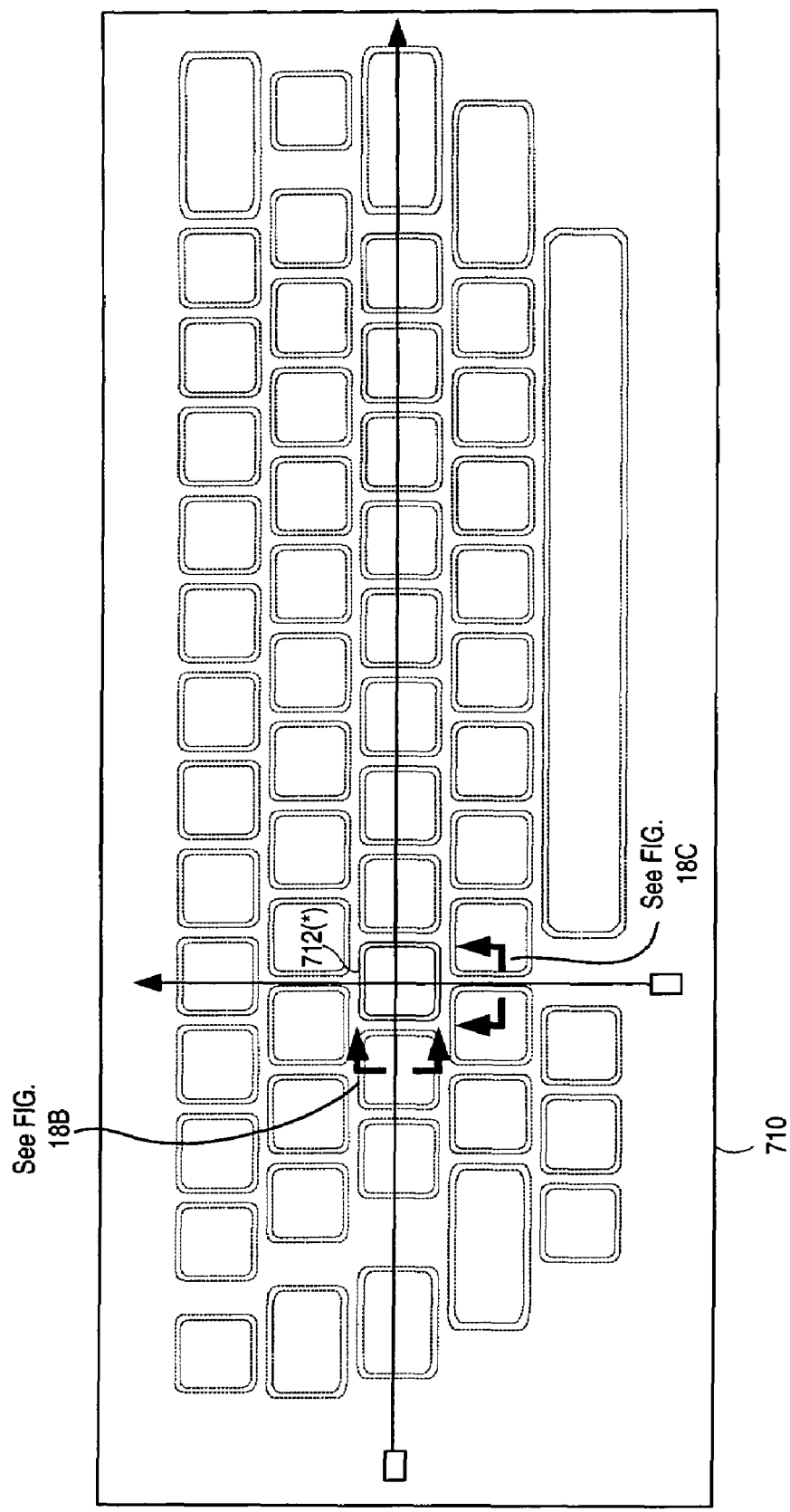
FIGS. 18A-C show a keyboard according to at least some additional embodiments.
Figure 18B:
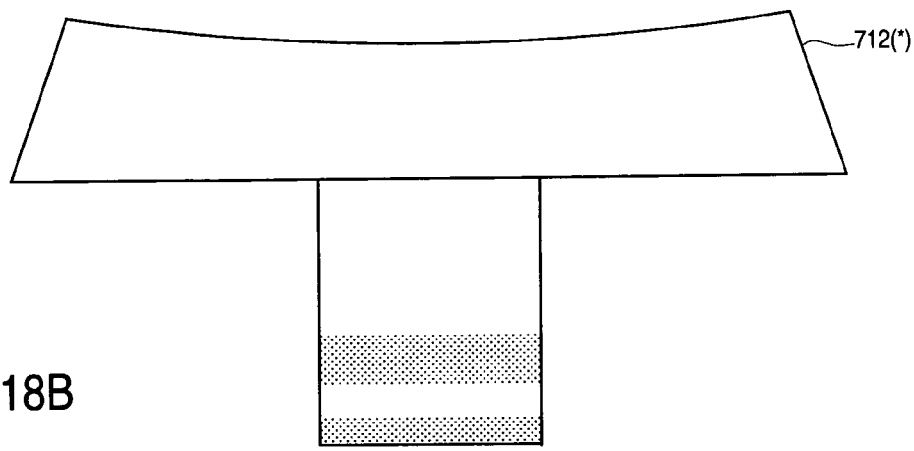
Figure 18C:
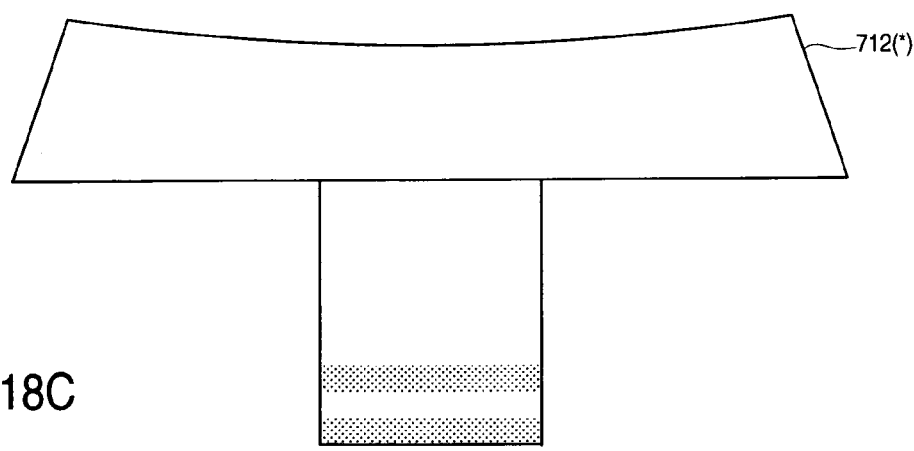

FIGS. 18A-18C show a keyboard according to at least some additional embodiments. In the embodiment of FIGS. 18A-18C, one or more keys of keyboard 710 have plungers in which different patterns are placed on separate target areas. Thus, one of the sensors shown in FIG. 18A will detect the pattern of FIG. 18B when key 712(*) is pressed. Another of the sensors shown in FIG. 18A will detect the pattern of FIG. 18C when key 712(*) is pressed. In this manner, a unique pattern for a key can be spread over two target areas. This may be useful, e.g., if a key has an exceptionally short stroke and there is insufficient space on one target area to hold an entire pattern.

Figure 19A:
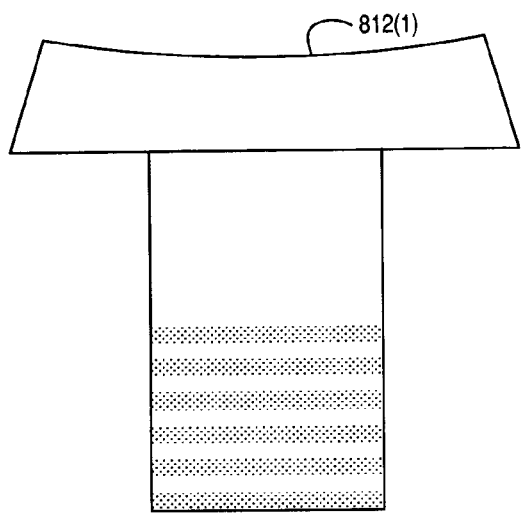
FIGS. 19A-D show key targets according to at least some additional embodiments.
Figure 19B:
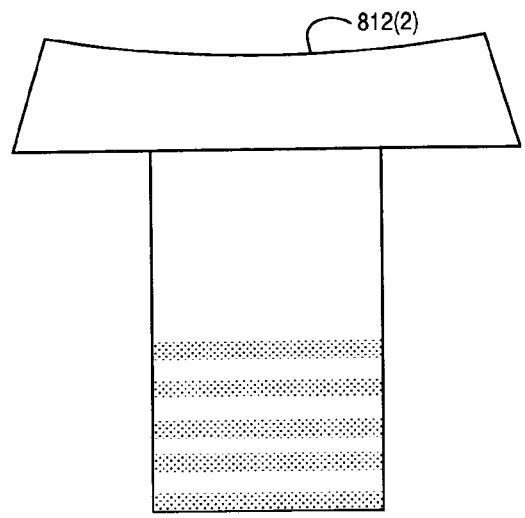
Figure 19C:
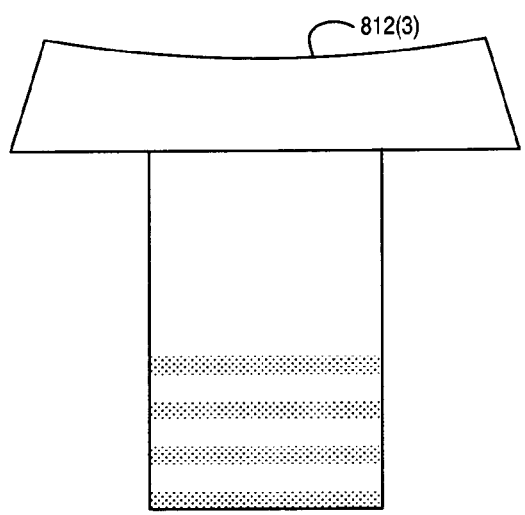
Figure 19D:
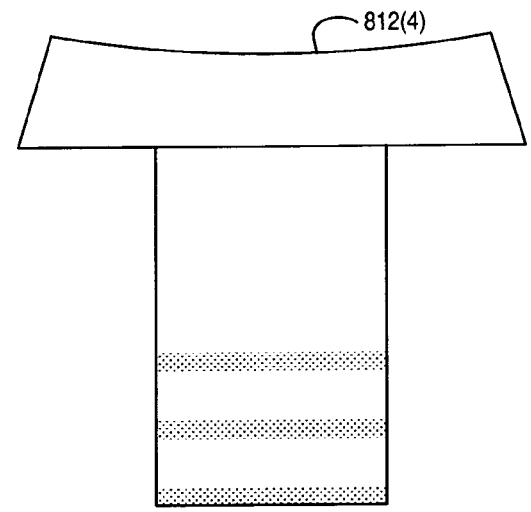

FIGS. 19A-19D are examples of key targets according to at least some additional embodiments. In a keyboard or other control device according to such embodiments, the height of speckling and non-speckling bands is not determined. Instead, the number of detected speckling bands is used to identify a key. As seen in FIG. 19A, key 812(1) has six speckling bands. Key 812(2) of FIG. 19B has five speckling bands, while keys 812(3) (FIG. 19C) and 812(4) (FIG. 19D) respectively have four and three speckling bands. Direction of key movement could be determined by, e.g., maintaining an up/down flag for each key (as discussed above).

Although examples of carrying out the invention have been described, those skilled in the art will appreciate that there are numerous variations and permutations of the above described devices that fall within the spirit and scope of the invention as set forth in the appended claims. For example, the speed of a key press can also be reported by detection circuitry in combination with the identity of a pressed key. This speed data could then be used by application software as another type of input (e.g., changing to a bold font if a key is pressed very fast). The invention is not limited to keyboards, and includes other types of input devices in which a user may manipulate keys, buttons, levers, switches or other types of control pieces. It is to be understood that the subject matter defined in the appended claims is not necessarily limited to the specific features or acts described above. Rather, the specific features and acts described above are disclosed as example forms of implementing the claims.

The invention claim is:

1. A keyboard comprising:
   a first laser positioned to shine a beam;
   a plurality of movable keys, each key coupled to a separate target, each target having a pattern formed thereon corresponding to the coupled key, each pattern including at least one area formed from a first type of surface causing speckle when illuminated by the beam; and
   detection circuitry to determine that a key has been moved based on changes in first laser output when a pattern corresponding to the key is in the beam,
   wherein each of the patterns includes at least two areas formed from the first type of surface separated by at least one area formed from a second type of surface, and
   illuminating the second type of surface with the beam causes substantially less speckling than is caused by illuminating the first type of surface with the beam.

2. The keyboard of claim 1, wherein each of the patterns is unique, and wherein the detection circuitry is configured to identify each key based on its corresponding pattern.

3. The keyboard of claim 1, wherein
   as to each of the patterns, each of the at least two first type surface areas has an associated dimension, the associated dimensions forming a set of dimensions corresponding to the pattern, and
   the detection circuitry is configured to identify each key based on the set of dimensions corresponding to the key's pattern.

4. The keyboard of claim 3, wherein as to each of the patterns
   the at least one second type surface area has an associated dimension, and
   the corresponding set of dimensions includes the associated dimension for that at least one second type surface area.

5. The keyboard of claim 3, wherein the detection circuitry is configured to determine whether a moved key has been pressed or released based on the order of the dimensions in the set of dimensions corresponding to the pattern corresponding to the moved key.

6. The keyboard of claim 3, wherein the controller is configured to determine associated dimensions based on speed of the beam relative to the at least two first type surface areas.

7. The keyboard of claim 6, wherein the controller is configured to determine a dimension for a second type surface area based on a velocity of the beam across a first type surface area adjacent the second type surface area.

8. The keyboard of claim 1, further comprising second and third lasers, and wherein
   the first, second and third lasers shine respective first, second and third beams in a detection cavity,
   each key is coupled to an extension member movable into the detection cavity by pressing the coupled key, each extension member having a face on which is located the pattern corresponding to the coupled key, the extension member of a first key is positioned to place the first key's corresponding pattern into the first beam when the first key is pressed, the extension member of a second key is positioned to place the second key's corresponding pattern into the second beam when the second key is pressed, the extension member of a third key is positioned to place the third key's corresponding pattern into the third beam when the third key is pressed, the detection circuitry is configured to determine that the first key has been moved based on changes in output of the first laser, the detection circuitry is further configured to determine that the second key has been moved based on changes in output of the second laser output, and the detection circuitry is further configured to determine that the third key has been moved based on changes in output of the third laser.

9. The keyboard of claim 8, wherein the first, second and third keys are in different key rows.

10. The keyboard of claim 8, wherein the first, second and third keys are in the same key row.

11. The keyboard of claim 10, wherein the keyboard has multiple key rows, and wherein the extension members of the first, second and third keys are offset from one another in the plane of the key rows.

12. The keyboard of claim 1, further comprising at least first and second optical fibers, and wherein the keys are arranged in multiple rows, the first optical fiber is coupled to the first laser and positioned to shine a beam along a first of the multiple key rows, and the second optical fiber is coupled to the first laser and positioned to shine a beam along a second of the multiple key rows.

13. A keyboard comprising:

a first laser positioned to shine a beam;

a second laser;

a plurality of movable keys, each key coupled to a separate target, each target having a pattern formed thereon corresponding to the coupled key, each pattern including at least one area formed from a first type of surface causing speckle when illuminated by the beam; and detection circuitry configured to determine that a key has been moved based on changes in first laser output when a pattern corresponding to the key is in the beam, and wherein the first and second lasers shine respective first and second beams in a detection cavity, each key of the plurality is coupled to an extension member movable into the detection cavity by pressing of that key, each extension member having first and second faces, the first and second faces of each extension member each include the pattern corresponding to the coupled key, the first laser is positioned such that pressing a key causes movement of the pressed key's first face pattern into the first beam, the second laser is positioned such that pressing the key causes movement of the pressed key's second face pattern into the second beam, and the detection circuitry is configured to determine that the key has been pressed based on changes in output by the first or second lasers.

14. An apparatus comprising:

a housing;

the detection region located within the housing;

a laser configured to shine a beam within the detection region;

a first control piece coupled to a target having a first pattern, the first pattern including at least one area formed from a first type of surface causing speckle when illuminated by the beam, the first control piece movable to place the first in the beam;

a second control piece coupled to a second target having a second pattern, the second pattern including at least one area formed from the first type of surface, the second control piece movable to place the second target in the beam, and wherein the first pattern is distinct from the second pattern, and a third control piece coupled to a third target having a third pattern, the third pattern including at least one area formed from the first type of surface, and wherein at least one of the first and second control piece is removable and replaceable with the third control piece, and the third control piece, after replacing the first or second control piece, is movable to place the third target in the beam; and detection circuitry configured to determine that the first control piece has been moved based on changes in laser output when the least one area is in beam and to distinguish the first, second and third patterns.

15. An apparatus comprising:

a housing;

a detection region located within the housing;

a laser configured to shine a beam within the detection region;

a first control piece to a target having a first pattern, the first pattern including at least one area formed from a first type of surface causing speckle when illuminated by the beam, the first control piece movable to place the first target in the beam;

a second control piece coupled to a second target having a second pattern, the second pattern including at least two areas formed from the first type of surface separated by a second type of surface, the second control piece movable to place the second target in the beam, and wherein the first pattern includes two areas formed from the first type of surface separated by the second type of surface, illuminating the second type of surface with the beam causes substantially less speckling than is caused by illuminating the first type of surface with the beam, each of the at least two first type surface areas of the first pattern has an associated dimension, each of the at least two first type surface areas of the second pattern has an associated dimension; and detection circuitry configured to determine that the first control piece has been moved based on changes in laser output when the at least one area is in the beam and to distinguish between the first and second control pieces based on the associated dimensions of the first and second patterns.

16. The apparatus of claim 15, wherein the detection circuitry is configured to determine associated dimensions based on speed of the beam relative to the first type surface areas.

* * * * *